United States Patent
Yamazaki et al.

(10) Patent No.: US 6,690,434 B1
(45) Date of Patent: Feb. 10, 2004

(54) ACTIVE MATRIX LIQUID CRYSTAL DISPLAY DEVICE

(75) Inventors: Shunpei Yamazaki, Tokyo (JP); Jun Koyama, Kanagawa (JP); Satoshi Murakami, Kanagawa (JP); Yukio Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/523,661

(22) Filed: Mar. 10, 2000

(30) Foreign Application Priority Data

Mar. 15, 1999 (JP) .............................. 11-067809

(51) Int. Cl.⁷ ...................... G02F 1/136; G02F 1/1333; G09G 3/20; H01L 29/04
(52) U.S. Cl. .................... 349/42; 349/44; 349/110; 349/138; 345/55; 257/59; 257/72
(58) Field of Search ............................. 349/44, 42, 110, 349/111, 138; 257/59, 72; 345/55

(56) References Cited

U.S. PATENT DOCUMENTS

| | | |
|---|---|---|
| 5,499,123 A | 3/1996 | Mikoshiba |
| 5,659,375 A | 8/1997 | Yamashita et al. |
| 5,748,165 A | 5/1998 | Kubota et al. |
| 5,782,665 A | 7/1998 | Weisfield et al. |
| 5,815,226 A | 9/1998 | Yamazaki et al. |
| 5,844,538 A | 12/1998 | Shiraki et al. |
| 5,959,599 A | 9/1999 | Hirakata |
| 5,966,193 A | 10/1999 | Zhang et al. |
| 6,013,930 A | 1/2000 | Yamazaki et al. |
| 6,097,454 A * | 8/2000 | Zhang et al. .................. 349/43 |
| 6,104,461 A | 8/2000 | Zhang et al. |
| 6,121,660 A | 9/2000 | Yamazaki et al. |
| 6,175,395 B1 * | 1/2001 | Yamazaki et al. ............ 349/44 |
| 6,219,113 B1 | 4/2001 | Takahara |
| 6,271,903 B1 * | 8/2001 | Shin et al. .................. 349/110 |
| 6,278,131 B1 | 8/2001 | Yamazaki et al. |
| 6,297,862 B1 * | 10/2001 | Murade ....................... 349/44 |
| 6,323,515 B1 | 11/2001 | Yamazaki et al. |
| 6,335,716 B1 | 1/2002 | Yamazaki et al. |
| 6,388,723 B1 * | 5/2002 | Iida et al. ................... 349/111 |
| 6,531,993 B1 | 3/2003 | Yamazaki et al. |

FOREIGN PATENT DOCUMENTS

| | | |
|---|---|---|
| EP | 0 691 565 | 1/1996 |
| JP | 9-281476 | 10/1997 |

* cited by examiner

*Primary Examiner*—Tarifur R. Chowdhury
(74) *Attorney, Agent, or Firm*—Eric J. Robinson; Robinson Intellectual Property Law Office, P.C.

(57) ABSTRACT

An active matrix liquid crystal display device capable of good quality image display is provided by disposing a shielding film on the active matrix substrate side and a shielding film on the opposing substrate side as overlapped. The active matrix liquid crystal display device is characterized by comprising a first substrate comprising a source signal line driver circuit and a first shielding film and a second substrate comprising a second shielding film, in that the second shielding film is overlapped with a portion of, or all of the source signal line driver circuit and the first shielding film and that the second shielding film are partially overlapped.

16 Claims, 31 Drawing Sheets

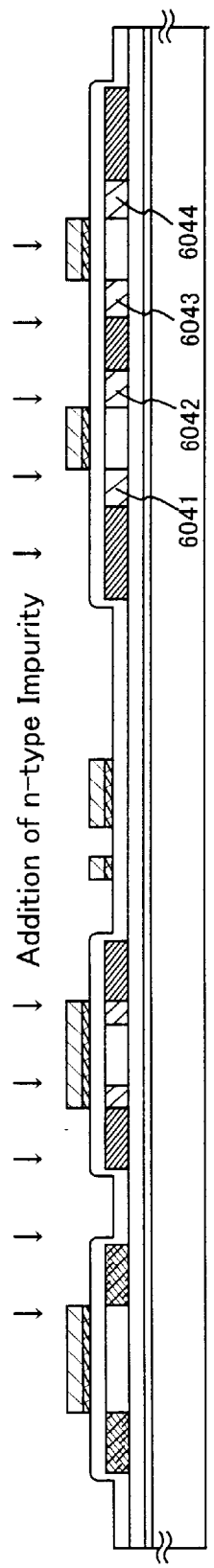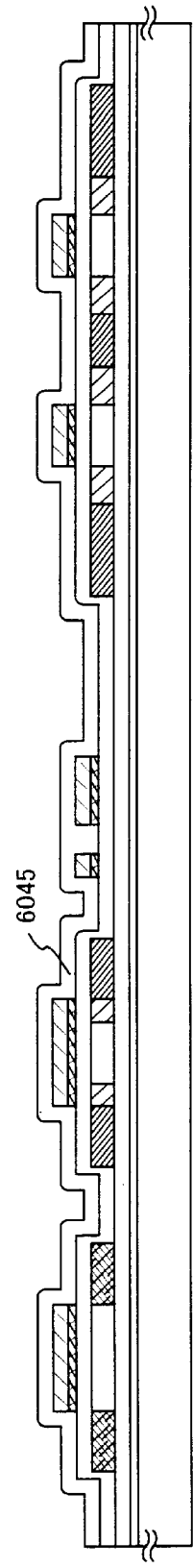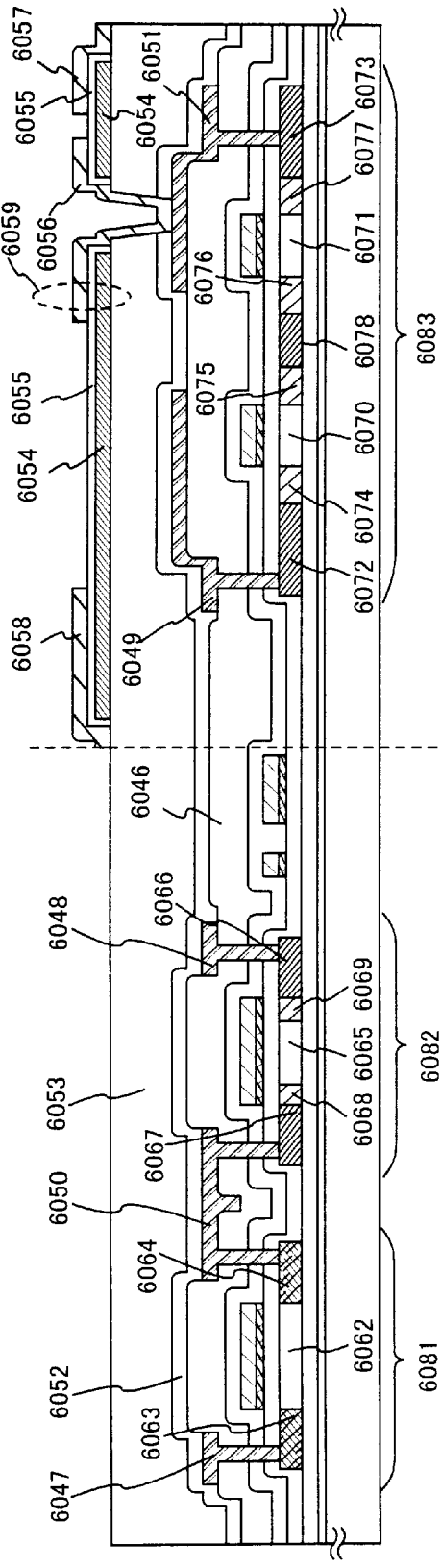

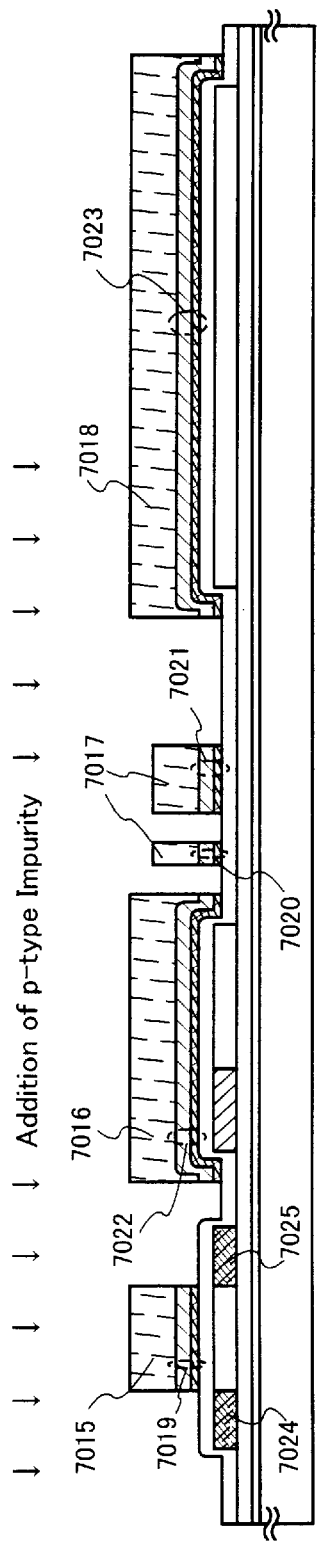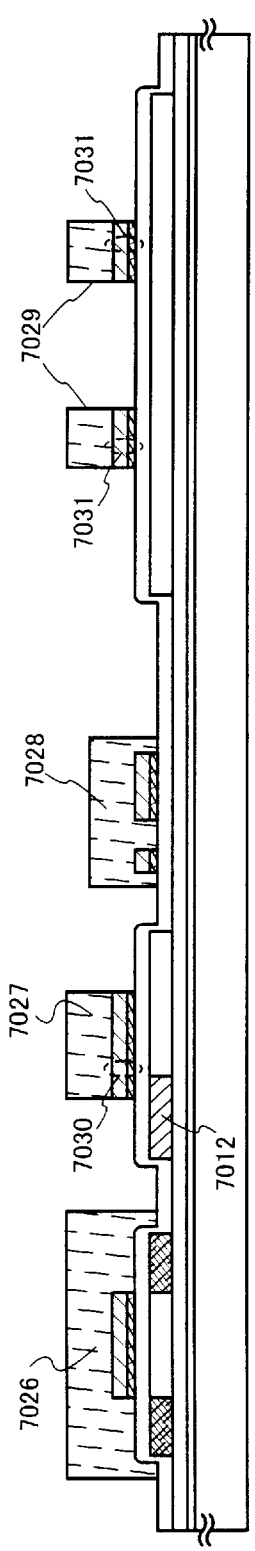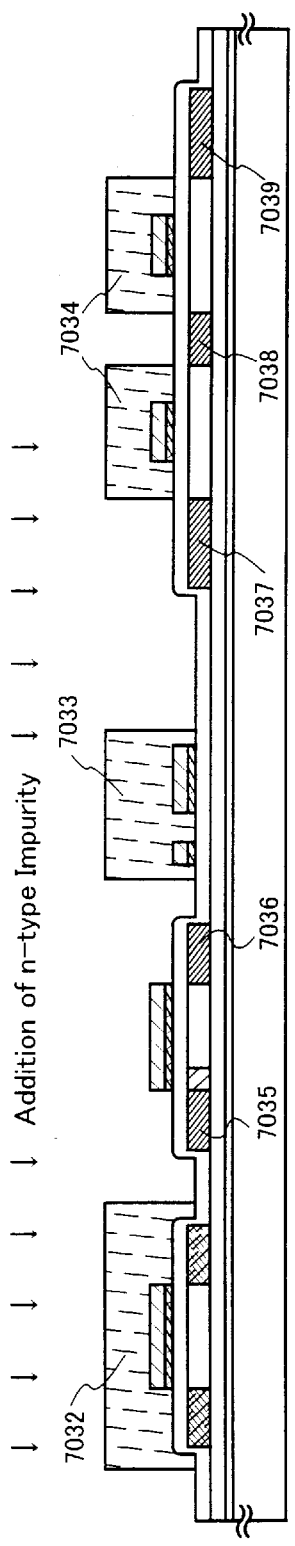

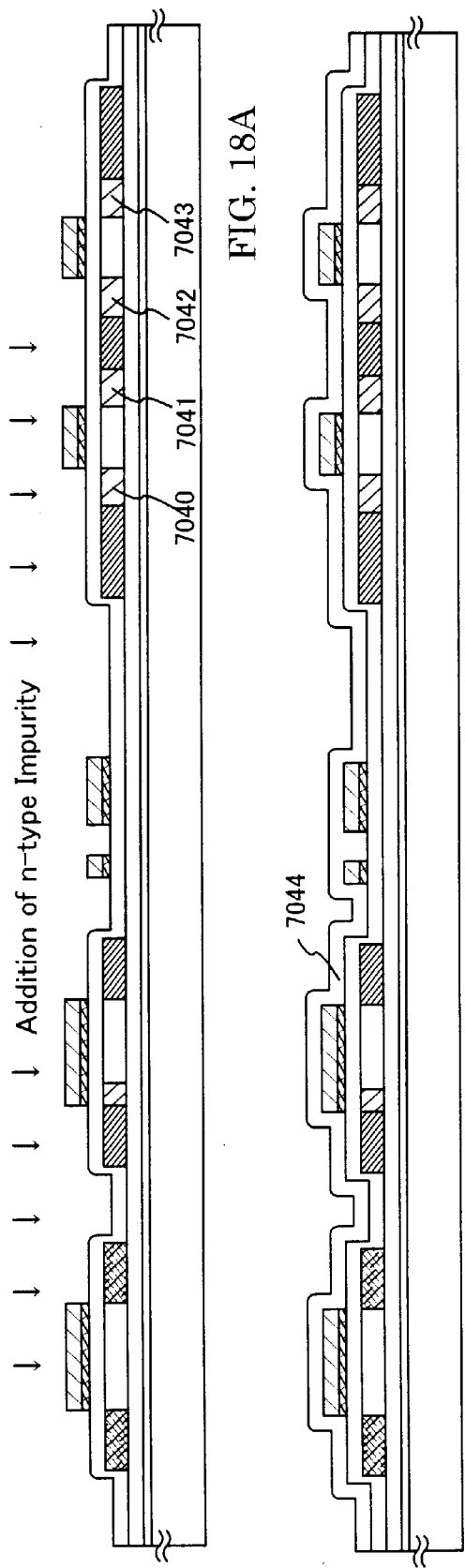
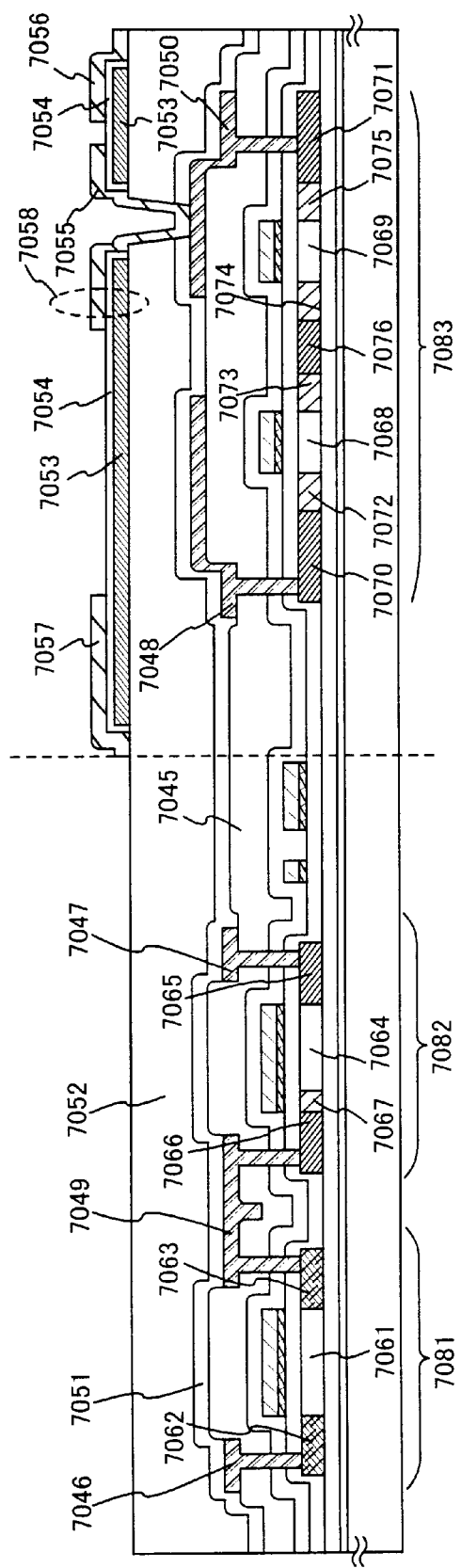
FIG. 18A
FIG. 18B
FIG. 18C

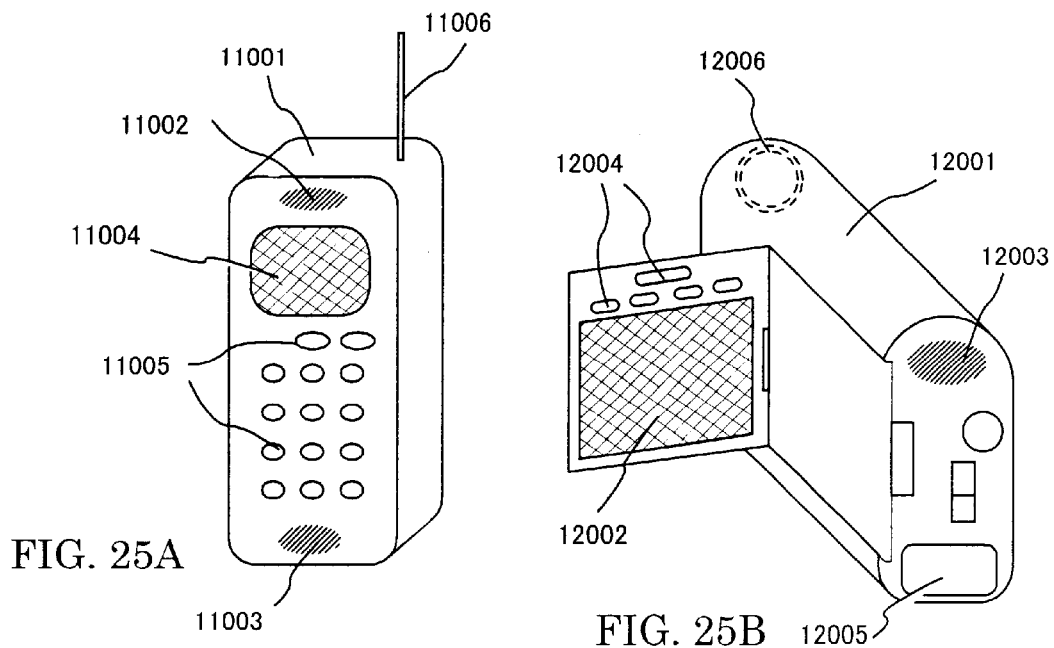
FIG. 25A
FIG. 25B
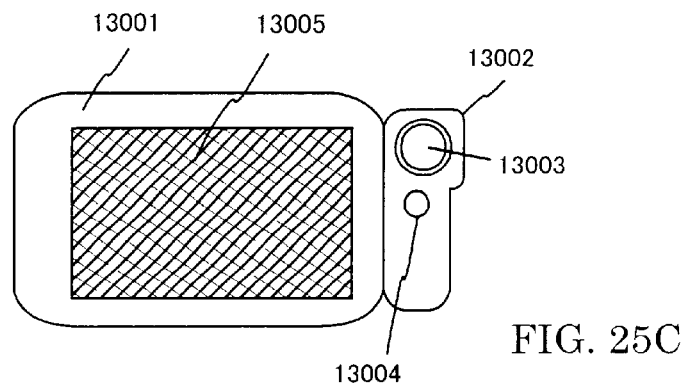
FIG. 25C
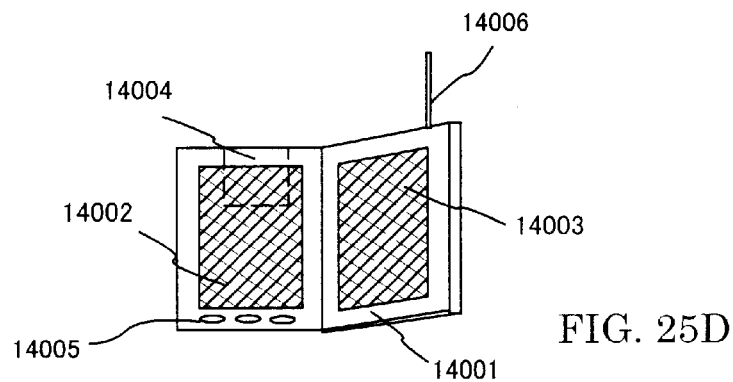
FIG. 25D

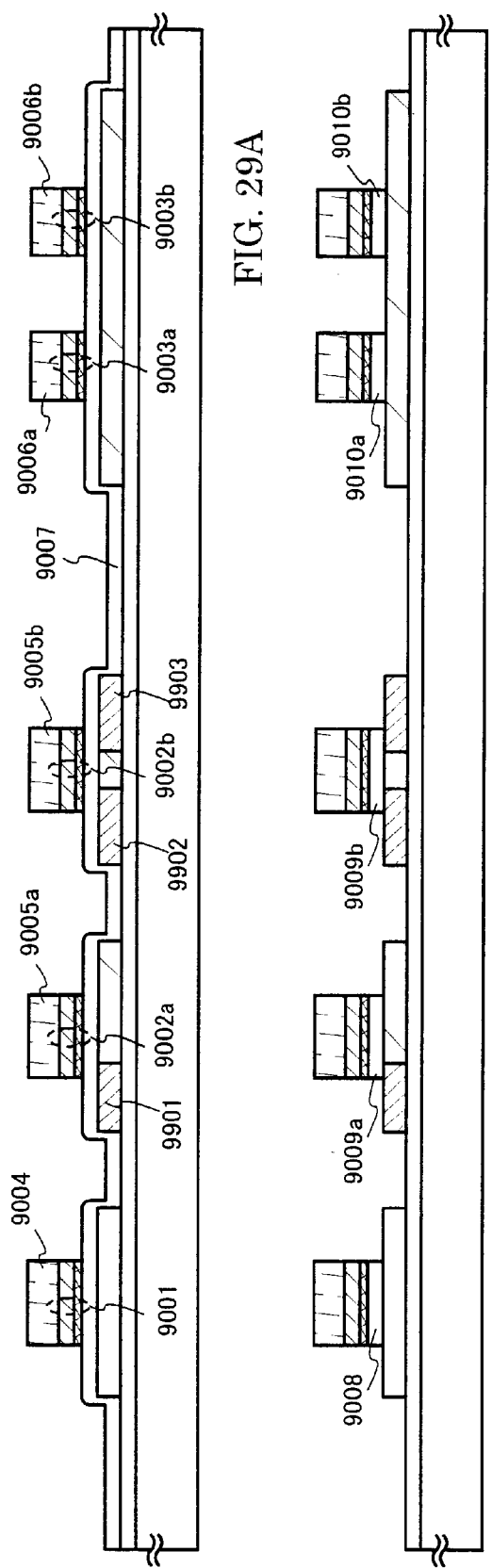
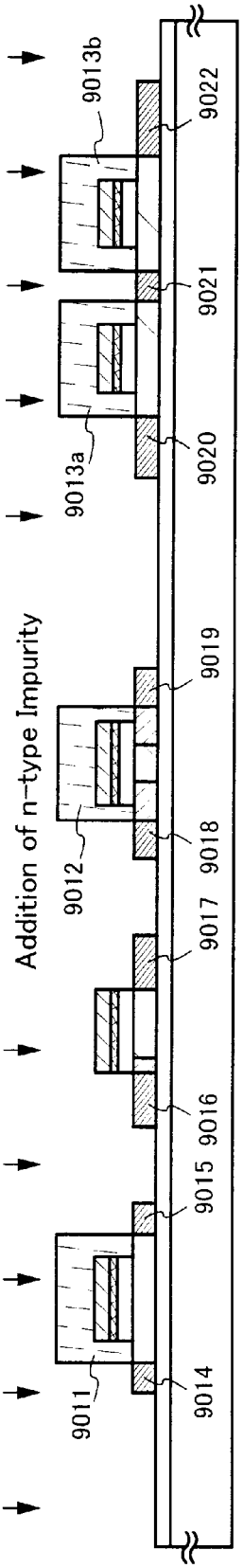
FIG. 29A
FIG. 29B
FIG. 29C

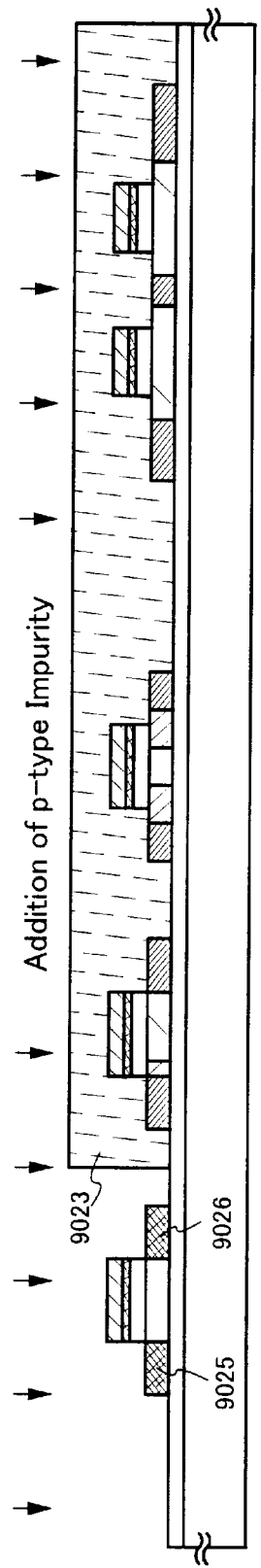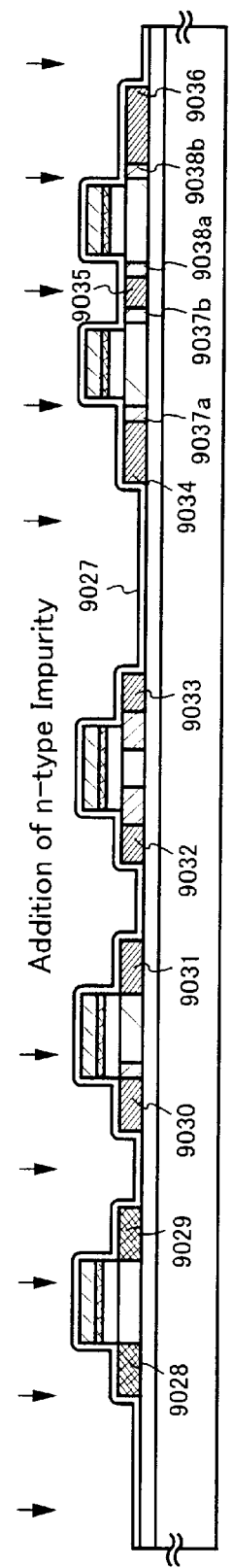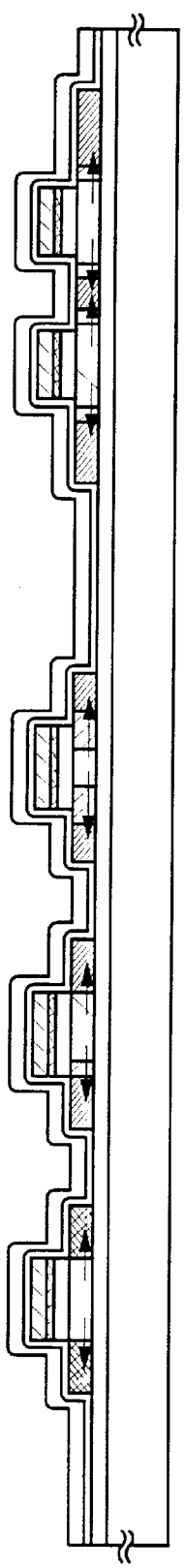

ACTIVE MATRIX LIQUID CRYSTAL DISPLAY DEVICE

BACKGROUND OF THE INVENTION

1. Field of the Invention

The present invention relates to a semiconductor device having a circuit comprising thin film transistors (hereinafter referred to as TFT) over a substrate having an insulating surface, and a manufacturing method therefor. In particular, the present invention relates to an electrooptic device typified by an active matrix liquid crystal display device in which a pixel matrix circuit and driving circuits disposed around thereof are provided on one substrate and to an electronic apparatus carrying such electrooptic device. It is noted that a semiconductor device refers to devices in general which function by utilizing the semiconductive characteristics including the above stated electrooptic device and the above stated electronic apparatus carrying the electrooptic device in the present specification.

2. Description of the Related Art

The technology for fabricating thin film transistors (TFT) on a low cost glass substrate has come to be rapidly developed in these days because the demand on an active matrix liquid crystal display has been increasing. The active matrix liquid crystal display is what a thin film transistor is disposed in each of several tens to several millions of pixels disposed in a matrix to control electric charge which goes in and out of each pixel electrode by the switching function of the thin film transistor.

Each pixel TFT is controlled by a circuit TFT dispose in the driver circuit region formed in the peripheral of the pixel matrix circuit.

As such, an active matrix liquid crystal display device has an integrated circuit in which pixel TFTs disposed in matrix as pixel matrix circuit, and circuit TFTs disposed in the driver circuit region, are integrated over the same substrate.

In general, a black matrix (BM) having light shielding property is disposed over wirings and transistor where visible radiation need not to transmit when the image is displayed by driving active matrix liquid crystal display device.

This is effective for preventing the thin film transistors to deteriorate by light-induced effect in the active layer (semiconductor layer), and for preventing eyes to recognize turbulence of the displayed image that occurs when the electric field is disturbed. In particular, disposition of shielding film is indispensable for the active matrix liquid crystal display device for projector use where a light of approximately 1,000,000 lux is applied, because the deterioration by light-induced effect is a major problem.

A metal thin film having light shielding property such as titanium or chromium film, or a resin material with dispersed black pigments may be used as shielding film. Conventionally the shielding film was formed on the opposing substrate side for the ease of manufacture.

However, in the cell assembly process, the alignment accuracy with the opposing substrate has been no good heretofore, and the circumstance was such that the desired position could not be shielded unless the shielding film was formed with a large alignment margin.

Fabricating shielding film with a large alignment margin leads to the decrease in the aperture ratio of the pixel matrix circuit, and thus was not preferable.

Further, the alignment margin is too large when disposing the shielding film on the opposing substrate side when the alignment technology remains as the present is, and the fear of incapability of corresponding to the device element miniaturization that should proceed in future, is suggested.

Accordingly a "BM on TFT" structure in which the shielding film is formed on the active matrix substrate side has become the mainstream recently. In this case, a shielding film is formed either upper or lower layer of the pixel electrode by interposing an interlayer insulating film, and the desired position can be shielded from the light.

The above stated "BM on TFT" structure enables reduction of the alignment margin to the least possible when forming shielding film, and is a very effective means to increase the aperture ratio.

As stated above, while the "BM on TFT" structure has various advantages, such effectiveness is displayed only when in the pixel matrix circuits, and drawbacks are caused in the driver circuit region.

A high speed operation is required for the circuit TFT disposed in the driver circuit region compared to that of the pixel TFT for its use. However, when the shielding film is formed over the driver circuit, a problem such as decrease in the operation speed by parasitic capacitance formed between the shielding film and the circuit TFT, arises.

The image display speed becomes slow as the operation speed of the circuit TFT decreases, and various problems such as the blink or the flicker of the displayed image should arise. In other words, extremely degrading the quality as an active matrix liquid crystal display device has become a problem.

SUMMARY OF THE INVENTION

The invention disclosed in the present specification has an object to provide a technology to realize an active matrix liquid crystal display device capable of high quality image display by solving above stated problems.

The present invention provides an active matrix liquid crystal display device comprising:
- a first substrate having a source signal line driver circuit and a first shielding film; and
- a second substrate having a second shielding film, characterized by:
  - providing all or a portion of the source signal line driver circuit over all or a portion of the second shielding film; and
  - providing a portion of the second shielding film over a portion of the first shielding film.

The present invention provides an active matrix liquid crystal display device comprising:
- a first substrate having a source signal line driver circuit, a gate signal line driver circuit, and a first shielding film; and
- a second substrate having a second shielding film, characterized by:
  - providing all or a portion of the source signal line driver circuit over all or a portion of the second shielding film;
  - providing all or a portion of the gate signal line driver circuit over all or a portion of the second shielding film; and
  - providing a portion of the second blac matrix film over a portion of the first shielding film.

BRIEF DESCRIPTION OF THE DRAWINGS

In the accompanying drawings:

FIGS. 8A and 8B are diagrams showing an idea of source line inversion.

FIGS. 15A to 15C are cross sectional diagrams showing a manufacturing process of thin film transistors of the present invention.

FIGS. 17A to 17C are cross sectional diagrams showing a manufacturing process of thin film transistors of the present invention.

FIGS. 18A to 18C are cross sectional diagrams showing a manufacturing process of thin film transistors of the present invention.

FIGS. 25A to 25D show examples of electronic devices using an active matrix liquid crystal display device of the present invention.

FIGS. 29A to 29C are cross sectional views showing manufacturing process of thin film transistors of the present invention.

FIGS. 30A to 30C are cross sectional views showing manufacturing process of thin film transistors of the present invention.

DETAILED DESCRIPTION OF THE PREFERRED EMBODIMENTS

The embodiment mode of an active matrix liquid crystal display device of the present invention is explained below. Provided, the active matrix liquid crystal display device of the present invention is not limited to the following embodiment mode.

Embodiment Mode 1

Figure 1:
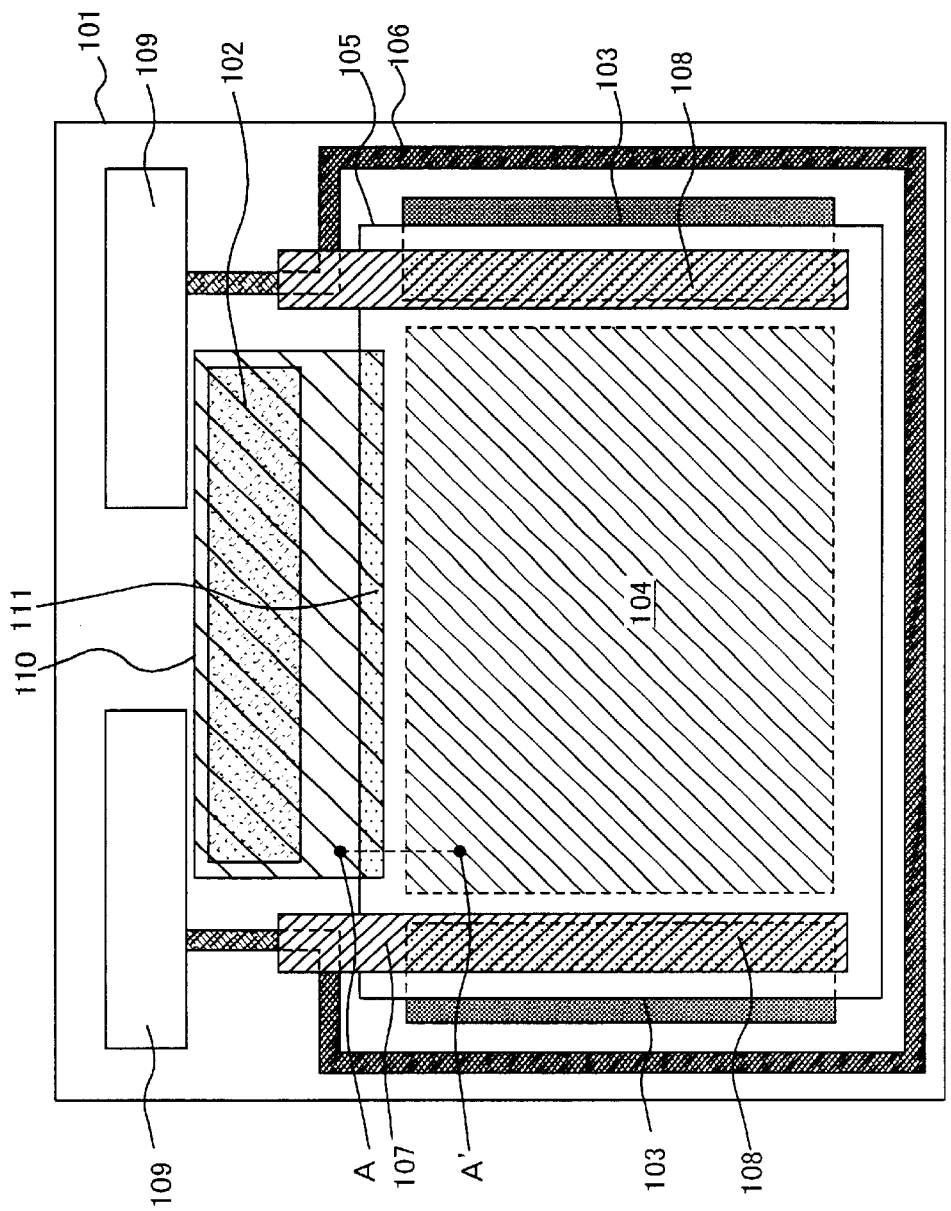
FIG. 1 is an outlined diagram showing the top view of an active matrix liquid crystal display device according to the present invention.

An outlined diagram of the top view of an active matrix liquid crystal display device according to the present invention is shown in FIG. 1. In FIG. 1, 101 is an active matrix substrate; circuit TFT's are disposed in the driver circuit region comprising a source signal line driver circuit 102 and a gate signal line driver circuit 103; and pixel TFT's are disposed in matrix in the pixel matrix circuit 104. As the active matrix substrate 101, a glass substrate etc. is be used.

ITO wiring 107 connected to common line 106 kept at a fixed electric potential (standard electric potential) is provided over the gate signal line driver circuit 103. In this specification ITO wiring denotes a wiring comprised of ITO (oxidized indium and oxidized tin). Common line 106 is connected to the external by a FPC 109 and kept at a fixed electric potential (standard electric potential) and the ITO wiring 107 which is connected to the common line 106 is also kept at the standard electric potential. A shielding film 105 is formed over the pixel matrix circuit 104 leaving the image display region (not shown),out where visible radiation needs to transmit. Although not shown in the figure, the shielding film 105 has a matrix form in effect.

It is preferred that the shielding film 105 comprises aluminum (Al), titanium (Ti), chromium (Cr) or tantalum (Ta). A resin material with dispersed black pigments can also be used. Although the shielding film 105 covers a portion of the gate signal line driver circuit 103, all of the gate signal line driver circuit 103 may also be covered. The shielding film 105 is in a floating state in which it is not connected to the common line. The ITO wiring 107 connected to the common line 106 has a dielectric substance (not shown) between the shielding film 105, forming a coupling capacitor 108 in a section where ITO wiring 107 is disposed over the black matrix 105. Although not shown in the figure, the shielding film 105 is in a matrix form in effect.

An opposing substrate is placed to face the active matrix substrate 101. An opposing shielding film 110 is formed in an area over source signal line driver circuit 102 on the opposing substrate to shield light at the circuit TFT of source signal line driver circuit 102. Although the present embodiment mode shows an example where the opposing shielding film 110 is disposed over entire source signal line driver circuit 102, to it may be disposed over only the sampling circuits of the source signal line driver circuit 102. Sampling circuit denotes a circuit which samples the image signal and inputs the signal to the source signal line.

Figure 2:
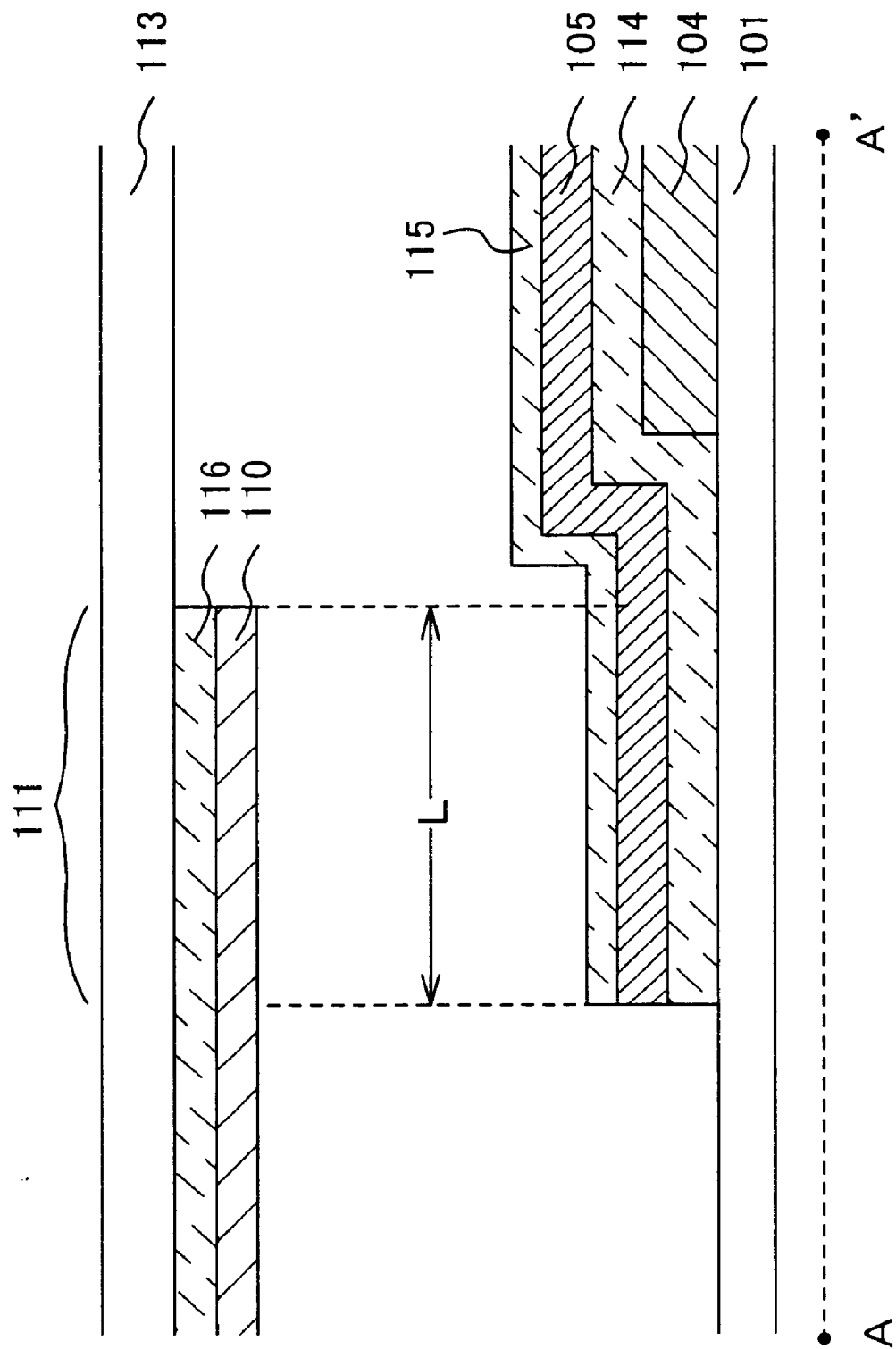
FIG. 2 is an outlined diagram showing a cross section of an active matrix liquid crystal display device according to the present invention.

The region where the opposing shielding film 110 is disposed over the shielding film 105 will be called a shielding area 111. FIG. 2 shows an outlined diagram at a cross section of A–A' in FIG. 1. A pixel matrix circuit 104 and an interlayer insulating film 114 are formed in this order over the active matrix substrate 101, and a shielding film 105 and an insulating film are formed over the active matrix substrate 101 and an interlayer insulating film 114. An opposing insulating film 116 is disposed in contact with the opposing substrate 113, and an opposing shielding film 110 is formed on the opposing insulating film 116.

The active matrix substrate 101 and the opposing substrate 113 are bonded by a sealant (not shown) with a spacer sandwiched therebetween. Therefore, the diameter of the spacer will determine the distance between the substrates (cell-gap). The sealant has a function to enclose the liquid crystal layer sandwiched between the active matrix substrate 101 and the opposing substrate 113. Therefore, an injecting window is formed in the sealant prior to injecting liquid crystal and is enclosed by an end-sealing material after liquid crystal injection.

It is preferable that the width L (alignment margin) of the shielding area 111 be over 20 $\mu$m. By holding the width L of the shielding area 111 at over 20 $\mu$m, it is possible to prevent a light from entering onto the source signal line driver circuit 102 and the OFF current of a circuit TFT in source signal line driver circuit 102 to increase. Further when the shielding film is comprised of a metal such as aluminum (Al), titanium (Ti), Chromium (Cr) or tantalum (Ta) etc., it is also possible to prevent error operation by incidence of electromagnetic waves into the driver circuit of source signal line driver circuit 102.

Figure 11:
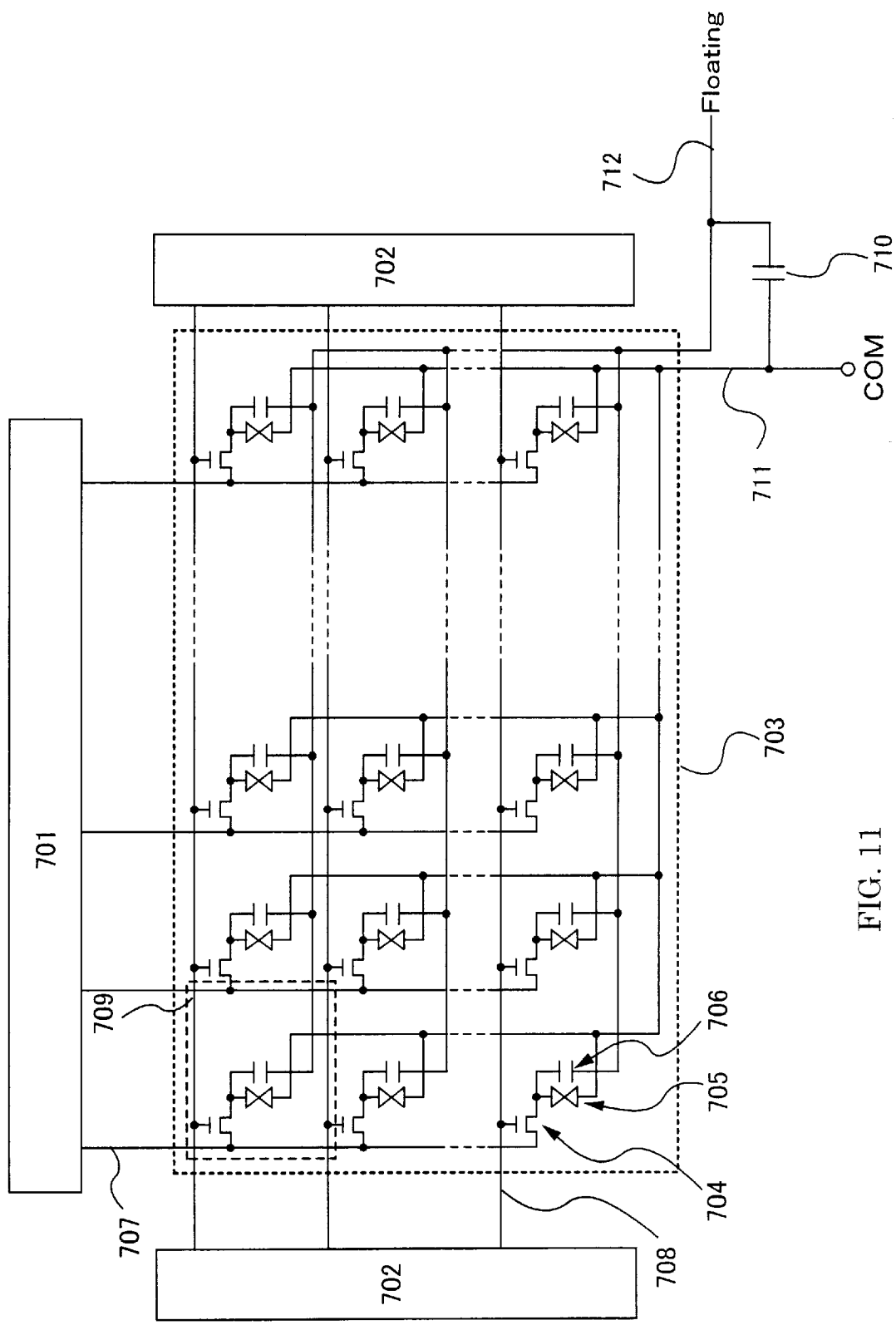
FIG. 11 is a circuit diagram of the active matrix liquid crystal display device according to the present invention.

An example of circuit diagram of an active matrix liquid crystal display device of the present embodiment mode in FIG. 11. A source signal line driver circuit 701 (102 in FIG. 1), a gate signal line driver circuit 702 (103 in FIG. 1), a pixel matrix circuit (104 in FIG. 1), pixel TFT 704, a liquid crystal cell 705 interposing liquid crystal between a pixel electrode and an opposing electrode, storage capacitor 706 formed by interposing a dielectric substance between a pixel electrode and a shielding film 712, a source signal line 707 and a gate signal line 708 are disposed as shown in FIG. 11.

coupling capacitor 710 (108 in FIG. 1) is formed between a black matrix 712 (105 in FIG. 1) which is in a floating state and a common line 711 (106 and 107 in FIG. 1). A source signal line driver circuit 701 and a gate signal line driver circuit 702 are designated in general as a driver circuit.

In the pixel matrix circuit 703, a source signal line 707 connected to a source signal line driver circuit 701 and a gate signal line 708 connected to a gate signal line driver circuit 702 are crossed. A thin film transistor of the pixel (pixel TFT) 704, liquid crystal cell 705 and a storage capacitor 706 are disposed in a pixel section 709, that is a region circled by the source signal line 707 and the gate signal line 708.

An image signal inputted to the source signal line 707 is selected by the pixel TFT 704 and written to a certain pixel electrode. An image signal sampled by a timing signal is supplied to the source signal line 707 in the source signal line driver circuit 701. A pixel TFT 704 drives by a selected signal inputted from a gate signal line driver circuit 702 through a gate signal line 708.

Figures 8A, 8B:
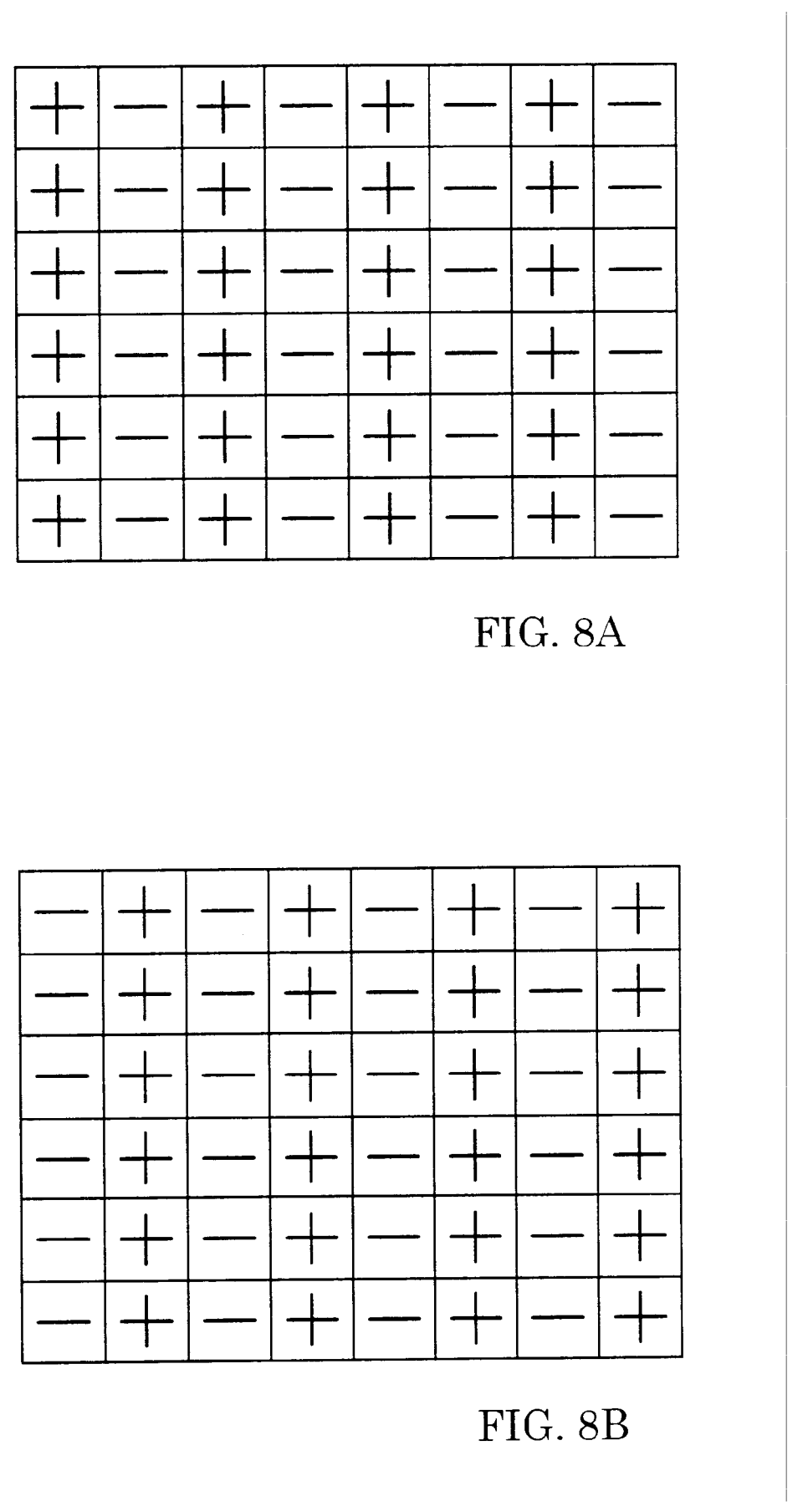

In the present embodiment mode, the pixel TFTs are driven by a source line inversion in which voltages of inverse polar are applied by each line of the source signal line 707 connected to the pixel TFT 704. This source line inversion is carried out to prevent liquid crystal from deteriorating by always applying an electric field of one orientation to the liquid crystal. That is, it is possible to prevent the deterioration of liquid crystal due to always applying the electric field of one orientation by applying the signal whose polarity is inverted per line of the source signal lines and by inverting the polarity of the signals per one frame period as shown in FIGS. 8A and 8B. One frame period is a period during which all pixels display one screen.

When the source line inversion is applied, the deviation of electric potential of the shielding film 105 in the floating state is also averaged. Accordingly, even when the shielding film is held at a fixed electric potential (standard electric potential) in which it is not connected to the common line (floating), the electric potential of the shielding film is kept at a fixed level when averaged by time. Therefore, even when the shielding film is held floating in the storage capacitor of a structure interposing a dielectric between the shielding film and the pixel electrode, the function as a storage capacitor can be accomplished sufficiently. Thus a more distinct image display having a better contrast can be obtained. determined by the amount of capacitance C of the coupling capacitor formed between the shielding film and the common line and the amount of electric charge Q charged in the shieldINg film. However; because the electric charge Q is fixed according to the pixel number and the voltage of signal inputted to the source signal line, the value of electric deviation $\Delta$V of the shielding film is actually determined by the capacitance C of the coupling capacitor. The larger the value of the C, the smaller the $\Delta$V, and that enables to keep the electric potential of the shielding film more definite. The capacitance of the coupling capacitor may be 10 times as much or more of the total capacitance of all the storage capacitors connected to one gate signal line through pixel TFTs.

In case of connecting the shielding film and the common line, it was necessary to open a contact hole in the interlayer insulating film disposed between the shielding film and the common line by photolithography using a mask. On the other hand, in case of forming a large capacitance coupling capacitor between a black matrix and a common line by holding the shielding film floating, such necessity was no more required. This reduced the manufacturing process of the active matrix liquid crystal display device, and accordingly accomplishment of a high yield and reduction in the manufacturing cost are possible.

An active matrix liquid crystal display device structured as stated above enables to efficiently shut out a visible radiation without decreasing aperture ratio because a "BM on TFT" structure is applied in the pixel matrix circuit. The aperture ratio of the active matrix liquid crystal display device actually fabricated by the inventors of the present application exceeded 60%.

Further, because an opposing shielding film 110 is disposed on the opposing substrate 113 side, the operation speed of the circuit TFT is not decreased due to the formation of parasitic capacitance formed between the opposing shielding film 110 and the circuit TFT.

The opposing shielding film 110 may cover the entire source signal line driver circuit 102 or only over the sampling circuits of the source signal line driver circuit. In other words, there is no need to conduct alignment with minute accuracy like as the shielding film 105 formed in the pixel matrix circuit, and therefore an opposing shielding film 110 can be disposed on the side of the opposing substrate 113.

Moreover, by providing the width L of the shielding area 111 with over 20 μm, it was possible to prevent the increase in OFF current in the circuit TFT by incidence of light into the source signal line driver circuit 102 even with the structure of the present invention which uses a pair of shielding films.

In addition, by driving the liquid crystal by source line inversion and by forming a coupling capacitor of a large capacitance between a shielding film and a common line by holding the shielding film floating, the deviation of the electric potential $\Delta V$ of the shielding film is reduced. The larger the value of the capacitance of the coupling capacitor, the smaller the $\Delta V$, and that enables to keep the electric potential of the shielding film more definite, and thus a better contrast and a more distinct image display can be obtained.

Embodiment Mode 2

Figure 3:
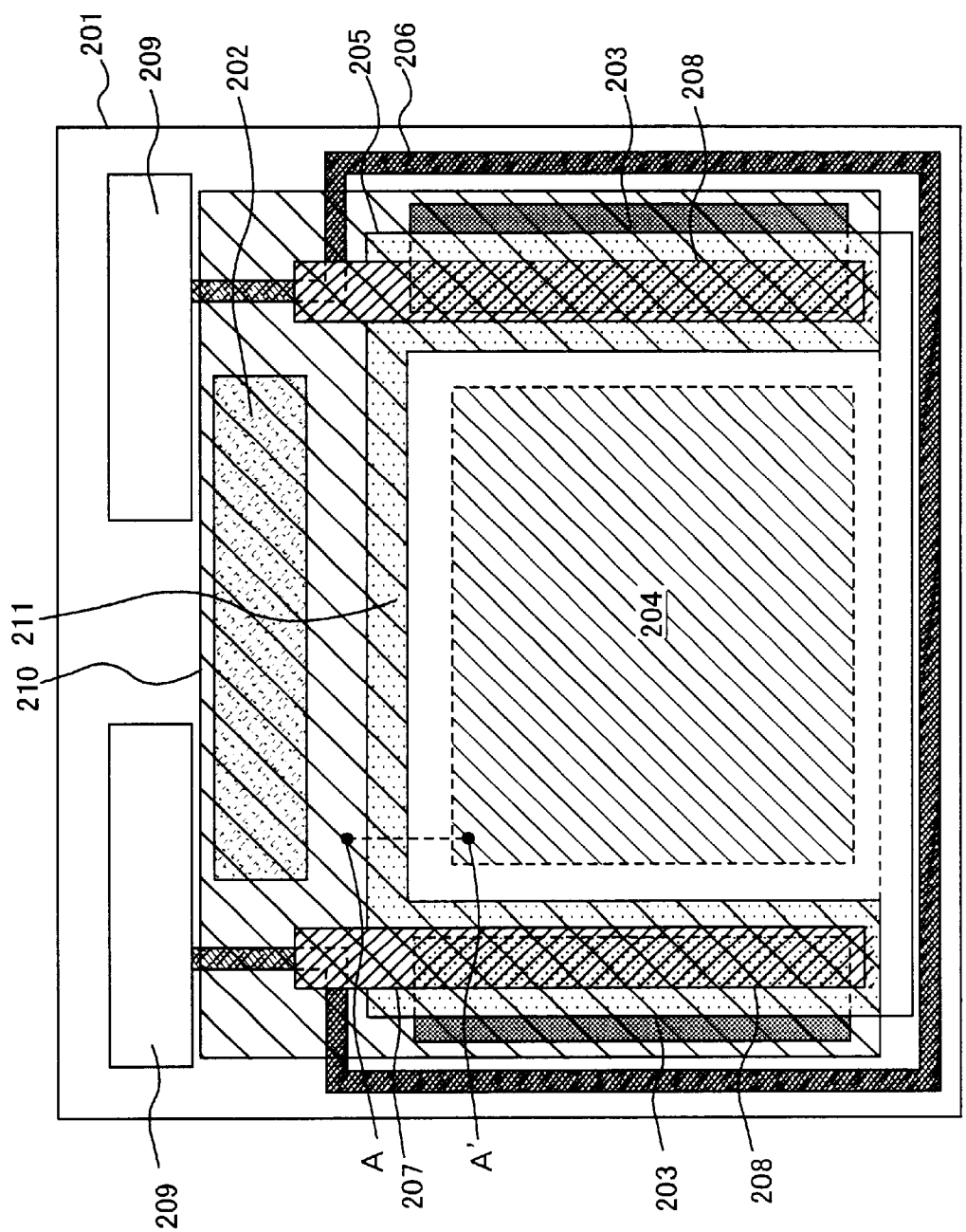
FIG. 3 is an outlined diagram showing the top view of an active matrix liquid crystal display device according to the present invention.

An outlined diagram of the top view of another embodiment mode of an active matrix liquid crystal display device according to the present invention is shown in FIG. 3. Denoted 201 is an active matrix substrate, circuit TFT are disposed in the driving circuit region comprising a source signal line driver circuit 202 and a gate signal line driver circuit 203 and pixel TFTs are disposed in a matrix in the pixel matrix circuit 204 in FIG. 3. A glass substrate, etc., may be used as an active matrix substrate 201.

An ITO wiring 207 is disposed over a gate signal line driver circuit 203 in connection with a common line 206 held at a fixed electric potential (standard electric potential). A common line 206 is connected to the outside through a FPC 209 and held at a fixed electric potential (standard electric potential), and an ITO wiring 207 which is connected to the common line 206 too is kept at a fixed voltage. A shielding film 205 is formed over the pixel matrix circuit 204 excluding the image display region (not shown) where a visible radiation needs to transmit. Although not shown in the figure, the shielding film 205 has a matrix form in effect.

It is preferred that the shielding film 105 comprises aluminum (Al), titanium (Ti), chromium (Cr) or tantalum (Ta). A resin material with dispersed black pigments can also be used. Although the shielding film 205 covers a portion of the gate signal line driver circuit 203, all of the gate signal line driver circuit 203 may be covered. The shielding film 205 is in a floating state in which it is not connected to the common line. The ITO wiring 207 connected to the common line 206 has a dielectric substance (not shown) between the shielding film 205 and the ITO wiring 207, forming a coupling capacitor 208 in a section where ITO wiring 207 is disposed over the black matrix 205.

An opposing substrate is placed to face the active matrix substrate 201. An opposing shielding film 210 is formed in an area over source signal line driver circuit 202 and gate signal line driver circuit 203 on the opposing substrate to shield light at the circuit TFT of source signal line driver circuit 202. Although the present embodiment mode shows an example where the opposing shielding film 210 is disposed over entire source signal line driver circuit 202 and gate signal line driver circuit 203, it may also be disposed over only the sampling circuits of the source signal line driver circuit 102 and over the entire gate signal line driver circuit 203.

Figure 4:
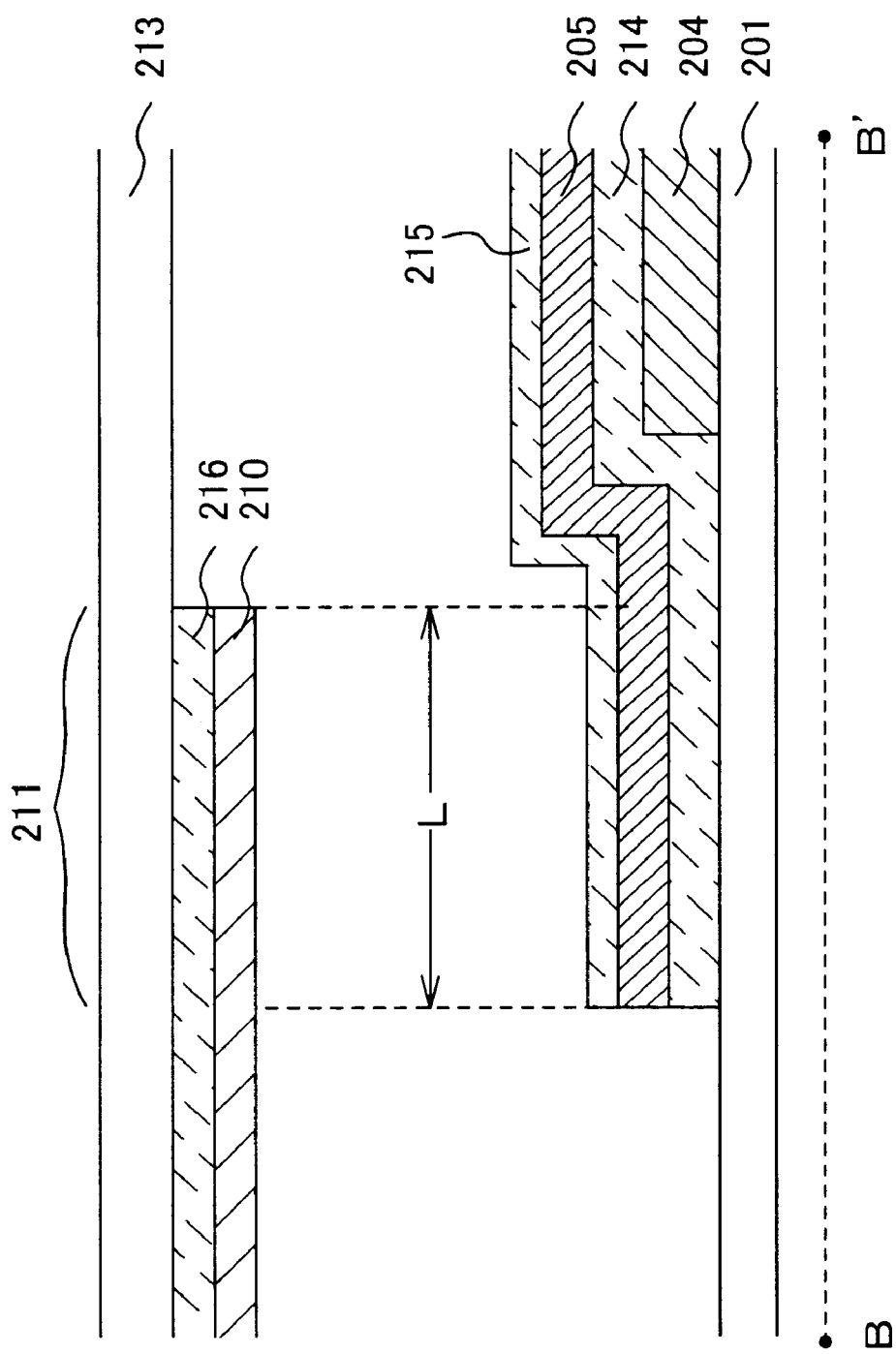
FIG. 4 is an outlined diagram showing a cross section of an active matrix liquid crystal display device according to the present invention.

The region where the opposing shielding film 210 is disposed over the shielding film 205 will be called a shielding area 211. FIG. 4 shows an outlined diagram on a cross section of A–A' in FIG. 3. A pixel matrix circuit 204 and an interlayer insulating film 214 are formed in this order over the active matrix substrate 201, and a shielding film 205 and an insulating film 215 are formed over the active matrix substrate 201 and an interlayer insulating film 214. An opposing insulating film 216 is disposed in contact with the opposing substrate 213, and an opposing shielding film 210 is formed on the opposing insulating film 216.

The active matrix substrate 201 and the opposing substrate 213 are bonded by a sealant (not shown) with a spacer sandwiched therebetween. Therefore, the diameter of the spacer will determine the distance between the substrates (cell-gap). The sealant has a function to enclose the liquid crystal layer sandwiched between the active matrix substrate 201 and the opposing substrate 213. Therefore, an injecting window is formed in the sealant prior to injecting liquid crystal and is enclosed by an end-sealing material after liquid crystal injection.

It is preferable that the width L (alignment margin) of the shielding area 111 be over 20 μm. By holding the width L of the shielding area 111 at over 20 μm, it is possible to prevent a light from entering onto the source signal line driver circuit 102 and the OFF current of a circuit TFT in source signal line driver circuit 102 to increase. Further when the shielding film is comprised of a metal such as aluminum (Al), titanium (Ti), Chromium (Cr) or tantalum (Ta) etc., it is also possible to prevent error operation by incidence of electromagnetic waves into the driver circuit of source signal line driver circuit 102.

Further, in the same way as the Embodiment Mode 1, the deterioration of the liquid crystal due to always applying an electric field of one polarity, is prevented by driving the liquid crystal by source line inversion.

As described in the Embodiment Mode 1, formation of storage capacitor whose structure is such that a dielectric is sandwiched between the shielding film and the pixel electrode is available, even when the shielding film is not connected to the common line, because the electric potential of the shielding film is kept constant when average by time by holding the shielding film floating without connecting to the common line and by driving the liquid crystal by source line inversion. Accordingly, there is no need to make a contact hole by photolithography using a mask in the interlayer insulating film disposed between the black matrix and the common line in order to connect the shielding film and the common line after formation of the shielding film by patterning. This reduced the manufacturing process of the active matrix liquid crystal display device, and accordingly accomplishment of a high yield and reduction in the manufacturing cost are possible.

In addition, by forming a coupling capacitor of a large capacitance between a shielding film and a common line by holding the shielding film floating, the deviation of the electric potential $\Delta V$ of the shielding film is reduced. The larger the value of the capacitance of the coupling capacitor, the smaller the ΔV, and that enables to keep the electric potential of the shielding film more definite, and thus a better contrast and a more distinct image display can be obtained.

Embodiment Mode 3

Examples of the active matrix liquid crystal display devices when a portion of the opposing shielding film is disposed over a portion of the shielding film, and the black matrix is floating, and has a coupling capacitor are explained in the Embodiment Mode 1 and 2. In the Embodiment Mode 3, examples when a portion of the opposing shielding film is disposed over a portion of the shielding film, and: 1) connecting the shielding film and the common line, and not forming a coupling capacitor; 2) the shielding film is floating and the coupling capacitor is not formed; or 3) connecting the shielding film and the common line, and forming a coupling capacitor; are explained.

Figure 9:
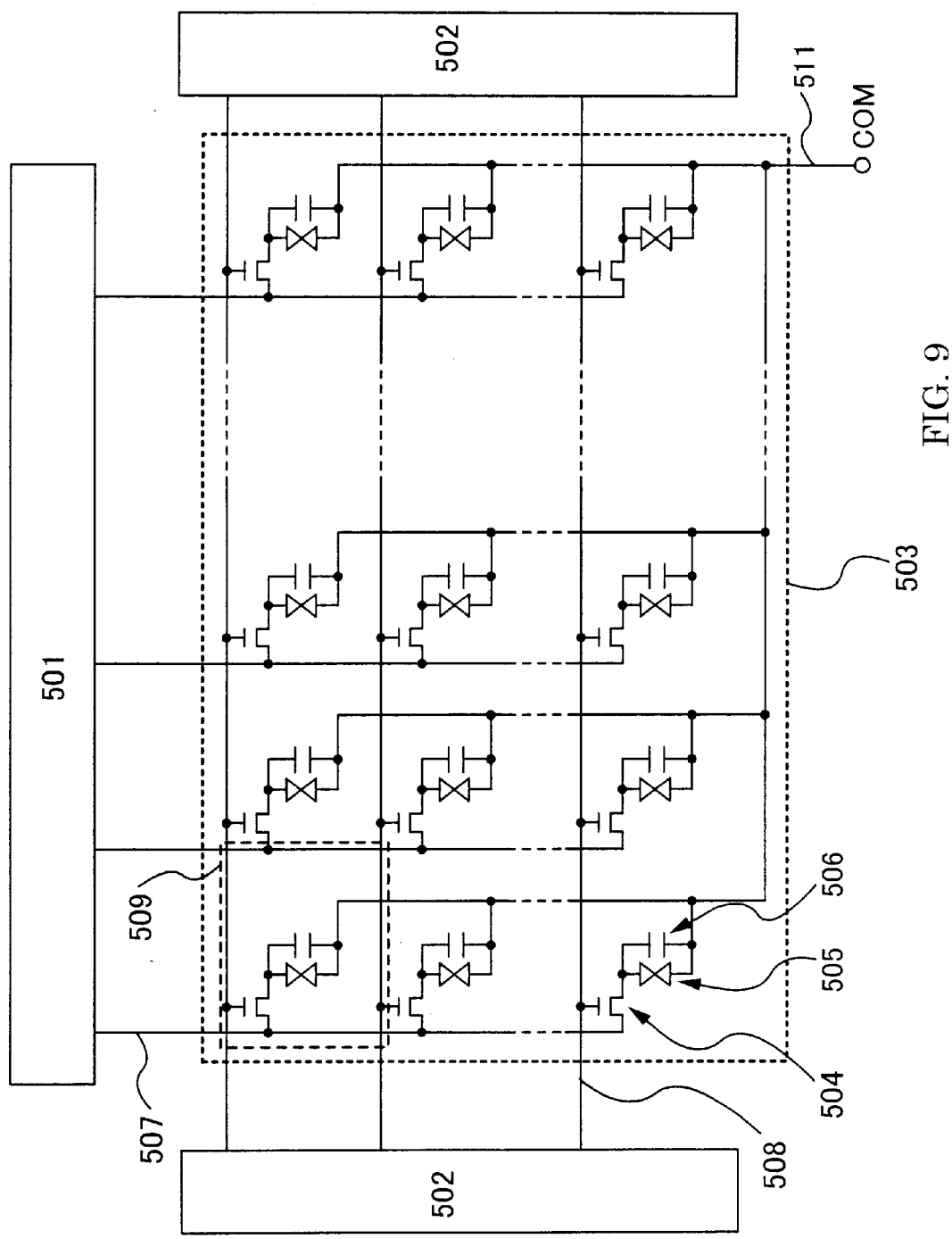
FIG. 9 is a circuit diagram of the active matrix liquid crystal display device according to the present invention.

An example of a circuit diagram of an active matrix liquid crystal display device according to 1) of the Embodiment Mode 3 is shown in FIG. 9. A source signal line driver circuit 501, gate signal line driver circuits 502, a pixel matrix circuit 503, a pixel TFT 504, a liquid crystal cell 505 interposing liquid crystal between a pixel electrode and a opposing electrode, a storage capacitor 506 formed by interposing a dielectric between a pixel electrode and a a shielding film, a source signal line 507 and a gate signal line 508 are disposed as shown in FIG. 9. The shielding film is connected to the common line 511.

The source signal line 507 connected to the source signal line driver circuit 501 and the gate signal line 508 connected to gate signal line driver circuit 502 crossed in a pixel matrix circuit 503. A thin film transistor of the pixel (pixel TFT) 504, the liquid crystal cell 505 and the storage capacitor 506 are disposed in a pixel section 509, that is a region circled by the source signal line 507 and the gate signal line 508.

An image signal inputted to the source signal line 507 is selected by the pixel TFT 504 and written to a certain pixel electrode. An image signal sampled by a timing signal is supplied to the source signal line 507 in the source signal line driver circuit 501. A pixel TFT 504 drives by a selected signal inputted from a gate signal line driver circuit 502 through a gate signal line 508.

Figure 10:
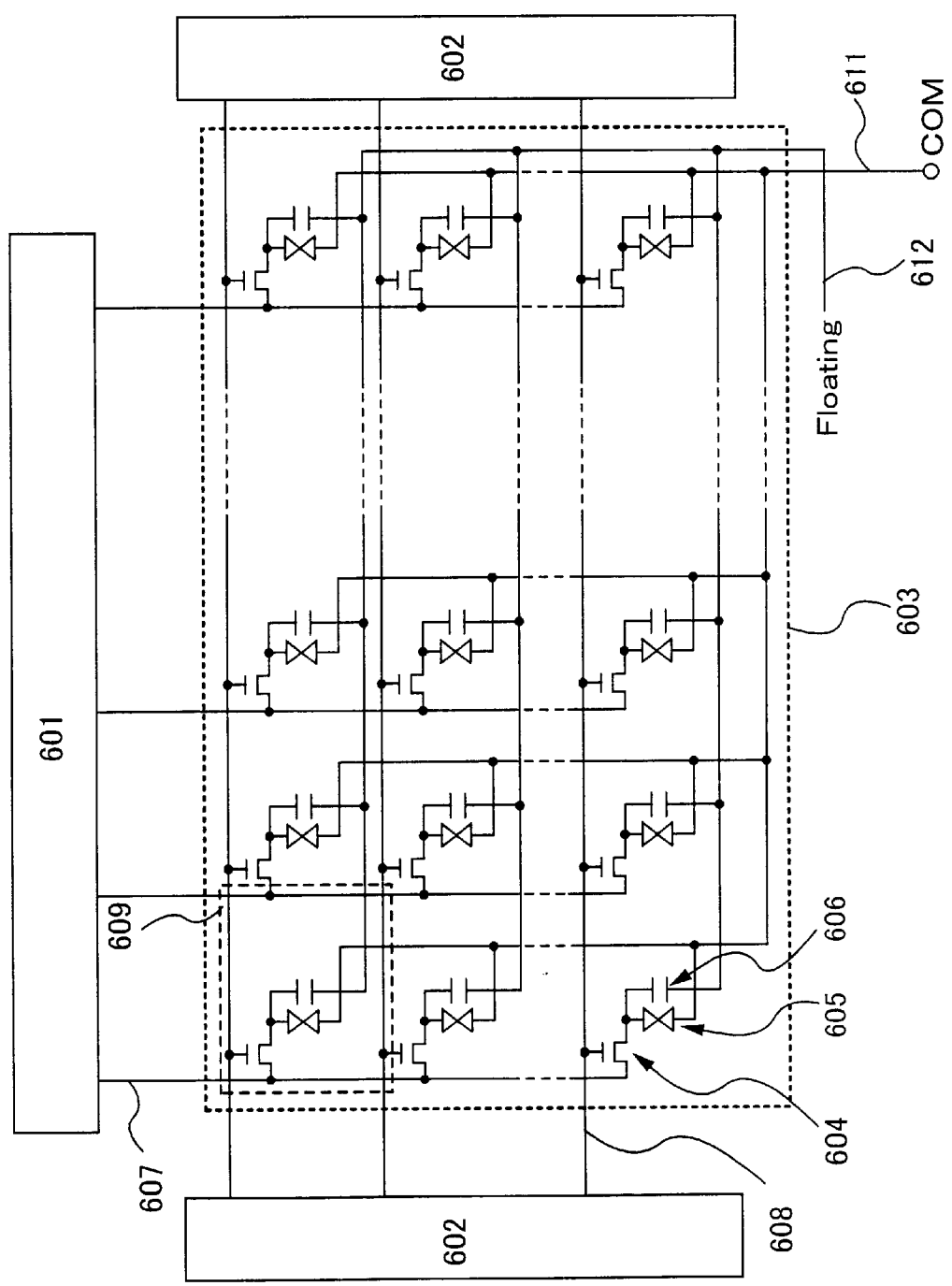
FIG. 10 is a circuit diagram of the active matrix liquid crystal display device according to the present invention.

An example of a circuit diagram of an active matrix liquid crystal display device according to 2) of the Embodiment Mode 3 is shown in FIG. 10. A source signal line driver circuit 601, gate signal line driver circuits 602, a pixel matrix circuit 603, a pixel TFT 604, a liquid crystal cell 605 interposing liquid crystal between a pixel electrode and a opposing electrode, a storage capacitor 606 formed by interposing a dielectric between a pixel electrode and a shielding film, a source signal line 607 and a gate signal line 608 are disposed as shown in FIG. 10. The shielding film 612 and the common line 611 are disposed as shown in FIG. 10.

The source signal line 607 connected to the source signal line driver circuit 601 and the gate signal line 608 connected to gate signal line driver circuit 602 crossed in a pixel matrix circuit 603. A thin film transistor of the pixel (pixel TFT) 604, liquid crystal cell 605 and a storage capacitor 606 are disposed in a pixel section 609, that is a region circled by the source signal line 607 and the gate signal line 608.

The storage capacitor 606 comprises a pixel electrode, shielding film 612 and dielectric interposed therebetween, and all of the shielding film 612 is in a state of floating in which they are not connected to the common line 611. Image signal inputted to source signal line 607 is selected by pixel TFT 604, and written to a certain pixel electrode.

An image signal sampled by the timing signal in the source signal line driver circuit 601 is supplied to source signal line 607. A pixel TFT 604 drives by a selected signal inputted from the gate signal line driver circuits 602 through the gate signal line 608.

Further, liquid crystal is driven by source line inversion in the Embodiment Mode 3. When the source line inversion is applied, the deviation of electric potential of the shielding film 612 is also averaged. Accordingly, even when the shielding film is held at a fixed electric potential (standard electric potential) in which it is not connected to the common line (floating), the electric potential of the shielding film is kept at approximately a fixed level when averaged by time. Therefore, even when the shielding film is held floating in the storage capacitor of a structure interposing a dielectric between the shielding film and the pixel electrode, the function as a storage capacitor can be accomplished sufficiently. Thus a more distinct image display having a better contrast can be obtained.

Further in this case, there is no need to make a contact hole by photolithograpy using a mask in the interlayer insulating film disposed between the black matrix and the common line in order to connect the shielding film and the common line after formation of the shielding film by patterning. This reduced the manufacturing process of the active matrix liquid crystal display device, and accordingly accomplishment of a high yield and reduction in the manufacturing cost are possible.

Figure 12:
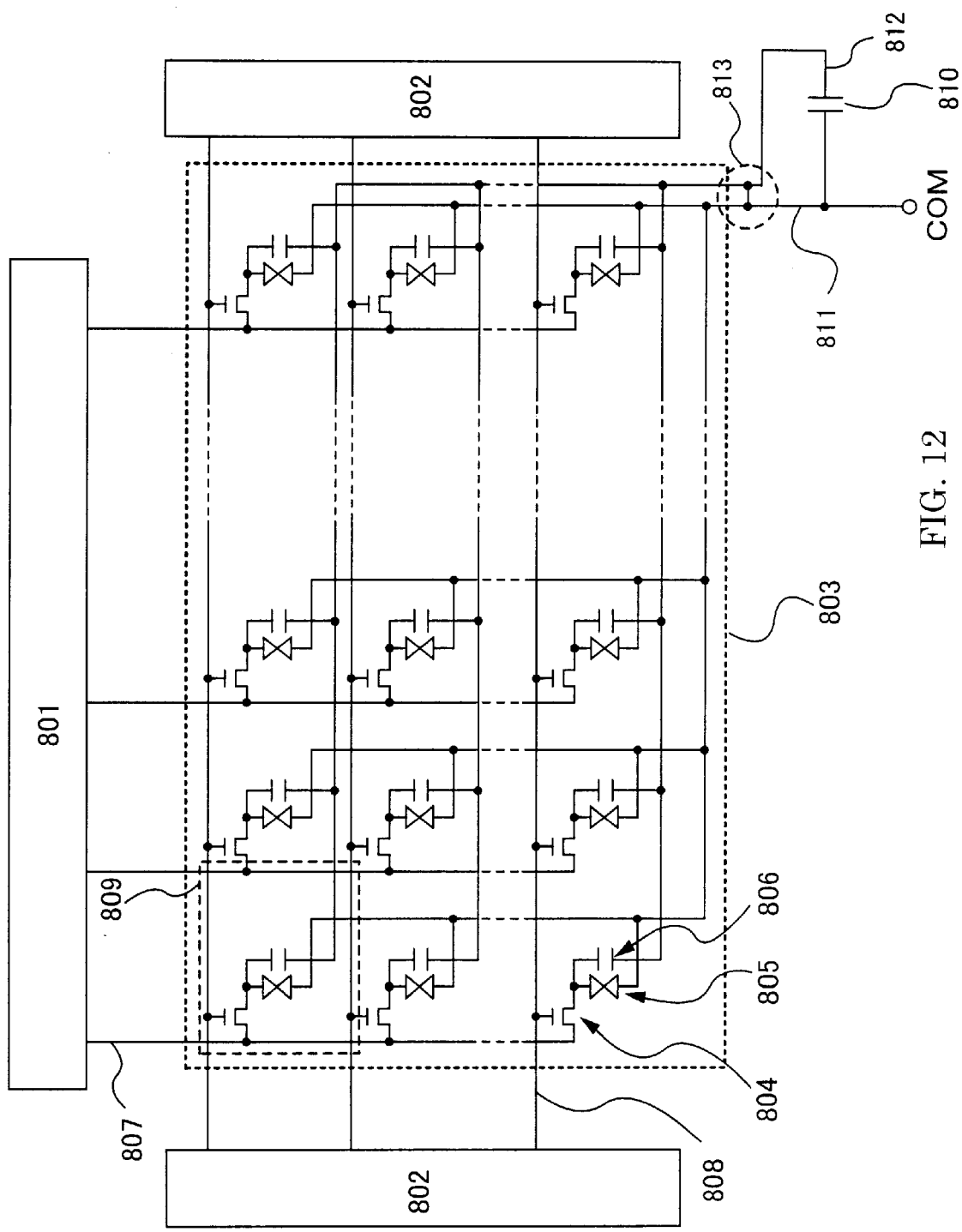
FIG. 12 is a circuit diagram of the active matrix liquid crystal display device according to the present invention.

An example of a circuit diagram of an active matrix liquid crystal display device according to 3) of the Embodiment Mode 3 is shown in FIG. 12. A source signal line driver circuit 801, gate signal line driver circuits 802, a pixel matrix circuit 803, a pixel TFT 804, a liquid crystal cell 805 interposing liquid crystal between a pixel electrode and a opposing electrode, a storage capacitor 806 formed by interposing a dielectric between a pixel electrode and a shielding film, a source signal line 807 and a gate signal line 808 are disposed as shown in FIG. 12. Further, a coupling capacitor 810 comprises a shielding film 812 and a common line 811, and the shielding film 812 and the common line 811 are connected.

The source signal line 807 connected to the source signal line driver circuit 801 and the gate signal line 808 connected to the gate signal line driver circuit 802 are crossed in a pixel matrix circuit 803. A thin film transistor of the pixel (pixel TFT) 804, the liquid crystal cell 805 and the storage capacitor 806 are disposed in a pixel section 809, that is a region circled by the source signal line 807 and the gate signal line 808.

The capacitance value of the coupling capacitor 810 comprising the shielding film 812 and the common line 811 may be 10 times as much as the total capacitance of the storage capacitors connected to one gate signal line through pixel TFTs.

An image signal inputted to the source signal line 807 is selected by the pixel TFT 804 and written to a certain pixel electrode. An image signal sampled by the timing signal in the source signal line driver circuit 801 is supplied to the source signal line 807. The pixel TFT 804 drives by a selected signal inputted from the gate signal line driver circuits 802 through the gate signal line 808.

In the Embodiment Mode 3, the shielding film is kept at a standard electric potential by connecting to a common line kept at a constant electric potential (standard electric potential). Further, by forming coupling capacitor from a common line and a shielding film, degradation of the image quality due to directly applying a noise from the electric source that is connected to the common line is prevented. Thus a more distinct image display having a better contrast can be obtained.

EMBODIMENTS

Embodiments of the present invention are described below.

Embodiment 1

An example of manufacturing method for simultaneously fabricating TFTs of the pixel matrix circuit and of the driver circuit disposed in the periphery for the active matrix liquid crystal display device of the present invention is described by using FIGS. 13A to 13C, 14A to 14C and 15A to 15C. The process described in this embodiment may be used for the fabrication of the semiconductor device in accordance with the present invention. Note that the present embodiment is merely an example of manufacturing method of the active matrix liquid crystal display device of the present invention, and the present invention is not limited to the manufacturing method.

Figure 13A:
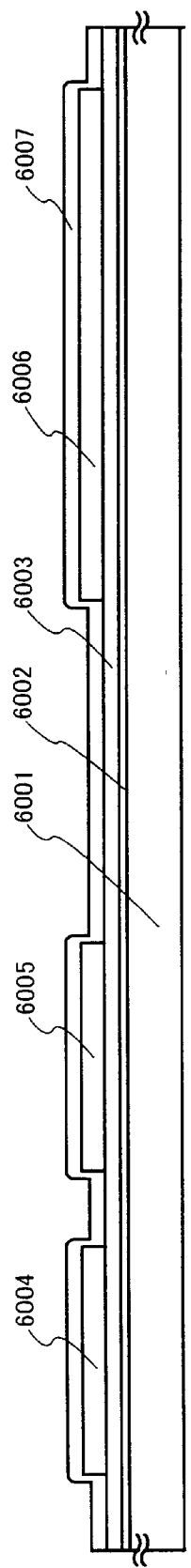
FIGS. 13A to 13C are cross sectional diagrams showing a manufacturing process of thin film transistors of the present invention.

Process for Forming an Island Semiconductor Layer and a Gate Insulating Film: FIG. 13A In FIG. 13A, it is preferable to use a non-alkali glass substrate or a quartz substrate as an active matrix substrate 6001. Besides them, the substrate may be a silicon substrate or a metal substrate on which an insulating film is formed.

An underlayer film made of a silicon oxide film, a silicon nitride film or a silicon nitride oxide film was formed into a thickness of 100 to 400 nm on the surface of the active matrix substrate 6001 where the TFTs are to be formed, by means of plasma CVD or sputtering. The underlayer film may be formed in the double-layer structure of the silicon nitride film 6002 of 25 to 100 nm thick, or 50 nm here, and of the silicon oxide film 6003 of 50 to 300 nm, or 150 nm here. The underlayer film is provided to prevent contamination of impurity from the substrate and needs not be provided always when the quartz substrate is used.

Next, an amorphous silicon film of 20 to 100 nm thick was formed on the underlayer film by means of publicly known film forming method. Although it depends on the hydrogen content, it is desirable to carry out the crystallization process after reducing the hydrogen content below 5 atomic % by heating several hours preferably in 400 to 550° C. to dehydrogenate it. Although the amorphous silicon film may be formed by another fabrication method such as sputtering or evaporation, it is desirable to fully reduce impurity elements such as oxygen and nitrogen contained in the film. Here, the underlayer film and the amorphous silicon film may be formed continuously because they may be formed by the same film-forming method. It is possible to prevent the contamination of the surface and to reduce the dispersion of characteristics of the fabricated TFTs by not exposing the underlayer film to the atmosphere once after forming it.

The process for forming the crystalline silicon film from the amorphous silicon film may be carried out by using the publicly known laser crystallization or thermal crystallization method. The crystalline silicon film may be fabricated by means of thermal crystallization by using a catalyst element which promote the crystallization of silicon. Beside them, a micro-crystal silicon film may be formed or a crystalline silicon film may be directly formed. The crystalline silicon film may be also formed by using the publicly known technology of SOI (Silicon On Insulators) by which single crystal silicon is adhered on the substrate.

The island semiconductor layers 6004 through 6006 were formed by etching unnecessary parts of the crystalline silicon film thus formed. Boron (B) may be added at concentration of $1\times10^{15}$ to $5\times10^{17}$ cm$^{-3}$ in advance in order to control threshold voltage in the region of the crystalline silicon film where the n-channel type TFT is fabricated.

Next, a gate insulating film 6007 whose main component is silicon oxide or silicon nitride was formed so as to cover the island semiconductor layers 6004 through 6006. The gate insulating film 6007 may be formed into a thickness of 10 to 200 nm or more preferably from 50 to 150 nm. For instance, a silicon nitride oxide film whose raw materials are $N_2O$ and $SiH_4$ and whose thickness is 75 nm is formed by means of plasma CVD. Then, it is thermally oxidized at 800 to 1000° C. within oxygen atmosphere or mixed atmosphere of oxygen and hydrochloric acid to form the gate insulating film of 115 nm (FIG. 13A).

Figure 13B:
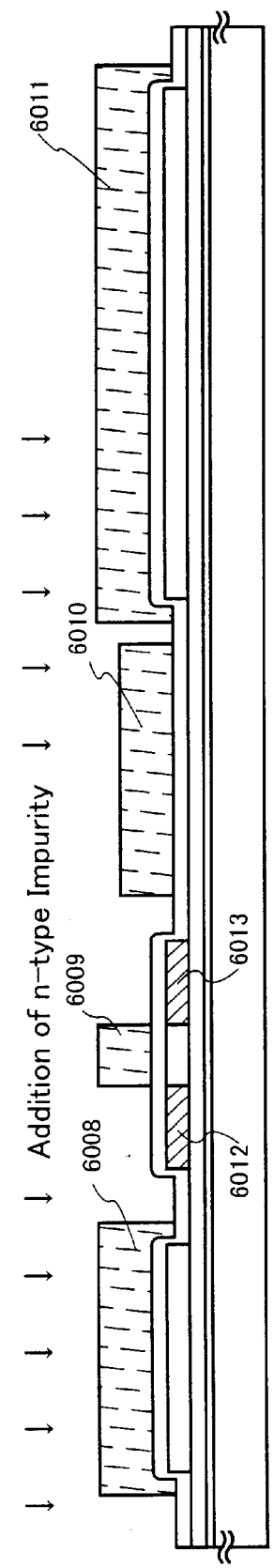

Forming n$^-$ Region: FIG. 13B

Resist masks 6008 through 6011 were formed on the whole surface of the region where the island semiconductor layers 6004 and 6006 and the wires are to be formed and at part of the island semiconductor layer 6005 (including the region which turns out to be a channel forming region) and impurity element imparting n-type was added to form low concentration impurity regions 6012 and 6013. The low concentration impurity regions 6012 and 6013 are impurity regions for forming an LDD region (called Lov region in the present specification. It is noted that 'ov' means 'overlap') which overlaps with the gate electrode via the gate insulating film in the n-channel TFT of the CMOS circuit later. It is noted that the concentration of the impurity element giving the n-type and contained in the low concentrate impurity regions will be indicated as (n$^-$) here. Accordingly, the low concentration impurity regions 6012 and 6013 may be said as n$^-$ regions within the present specification.

Here, phosphorus was added by means of plasma excited ion doping method without mass-separating phosphine ($PH_3$). The ion plantation which involves the mass-separation may be used if desired. In this process, phosphorus was added to the semiconductor layer under the gate insulating film 6007 via the gate insulating film 6007. Preferably, the concentration of phosphorus to be added was in a range of $5\times10^{17}$ to $5\times10^{18}$ atoms/cm$^3$ and was set at $1\times10^{18}$ atoms/cm$^3$ here.

After that, the resist masks 6008 through 6011 were removed and a thermal treatment of 1 to 12 hours was carried out within an nitrogen atmosphere in 400 to 900° C. or more preferably in 550 to 800° C. to activate the phosphorus added in this step.

Forming Conductive Film for Gate Electrode and Wire; FIG. 13

A first conductive film 6014 was formed into a thickness of 10 to 100 nm by a conductive material whose main component is an element selected from titanium (Ti), tantalum (Ta), tungsten (W) and molybdenum (Mo). It is preferable to use tantalum nitride (TaN) or tungsten nitride (WN) for example as the first conductive film 6014. A second conductive film 6015 is then formed into a thickness of 100 to 400 nm by a conductive material mainly composed of either one of elements of Ta, Ti, Mo and W on the first conductive film 6014. For instance, Ta may be formed into a thickness of 200 nm. Although not shown, it is effective to form a silicon film of 2 to 20 nm thick under the first conductive film 6014 to prevent oxidation of the conductive films 6014 and 6015 (the conductive film 6015 in particular).

Figure 14A:
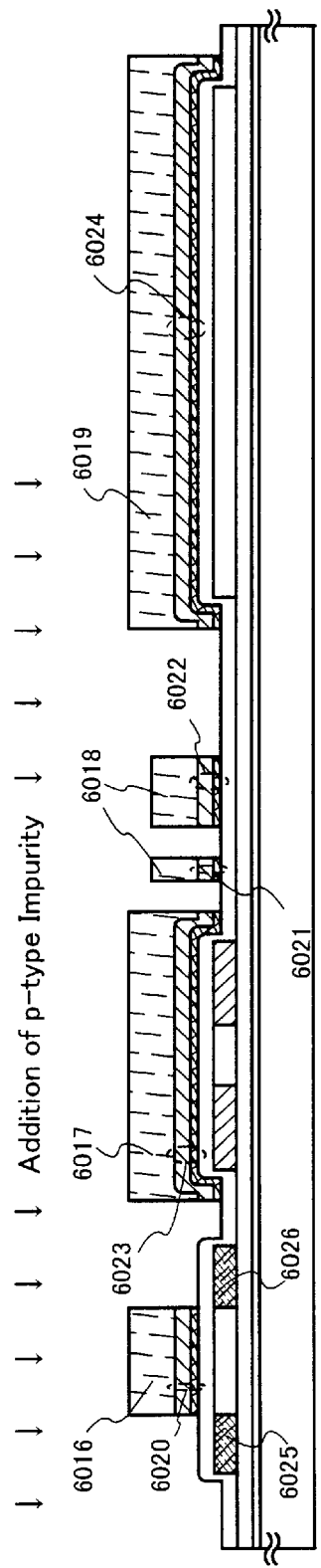
FIGS. 14A to 14C are cross sectional diagrams showing a manufacturing process of thin film transistors of the present invention.

Forming p-ch Gate Electrode and Wiring Electrode and Forming p+ Region: FIG. 14A Resist masks 6016 through 6019 were formed to etch the first and second conductive films (hereinafter referred to as laminated film) to form a gate electrode 6020 and gate signal lines 6021 and 6022 of a p-channel type TFT. It is noted that conductive films 6023 and 6024 were left so as to cover the whole surface of the region which turns out to be the n-channel TFT.

Then, a process of doping impurity elements which impart p-type at part of the semiconductor layer 6004 where the p-channel type TFT is to be formed was carried out by leaving the resist masks 6016 through 6019 as masks. Here, boron was doped as the impurity element by means of ion doping (ion implantation may be also used) by using diboran ($B_2H_6$). Here, boron was doped with concentration of $5 \times 10^{20}$ through $3 \times 10^{21}$ atoms/cm$^3$. It is noted that the concentration of the impurity element contained in the impurity region formed here and giving the p-type will be denoted as ($P^{++}$). Accordingly, the impurity regions 6025 and 6026 may be said as $P^{++}$ regions.

It is noted that the process of doping the impurity element giving the p-type may be carried out after etching the gate insulating film 6007 by using the resist masks 6016 through 6019 and exposing the part of the island semiconductor layer 6004. In this case, the island semiconductor film is less damaged and the throughput may be improved because the accelerating voltage may be low.

Figure 14B:
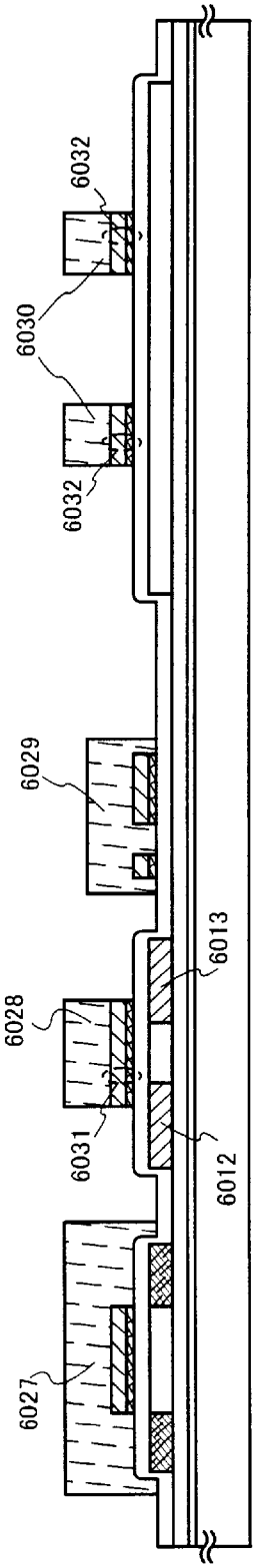

Forming n-ch Gate Electrode: FIG. 14B

Next, gate electrodes 6031 and 6032 of the n-channel type TFT were formed by forming resist masks 6027 through 6030 after removing the resist masks 6016 through 6019. At this time, the gate electrode 6031 was formed so as to overlap with the n$^-$ regions 6012 and 6013 via the gate insulating film 6007.

Figure 14C:
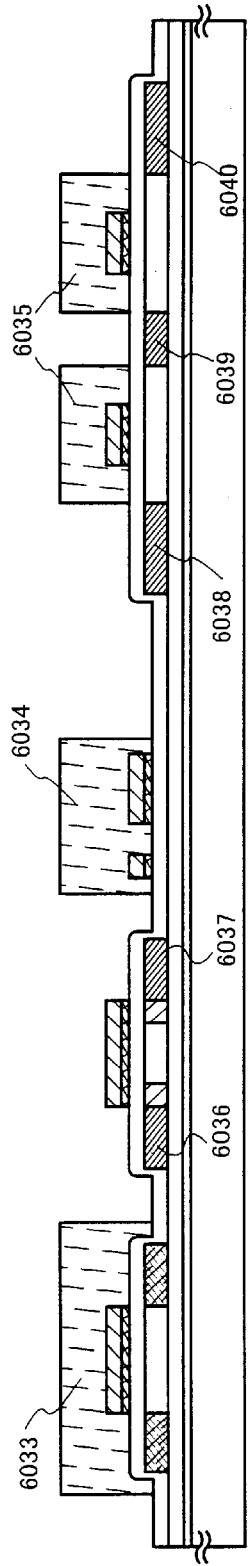

Forming n+ Region: FIG. 14C

Next, the resist masks 6027 through 6030 were removed and resist masks 6033 through 6035 were formed. Then, a process for forming an impurity region which functions as a source or drain region in the n-channel type TFT was conducted. The resist mask 6035 was formed so as to cover the gate electrode 6032 of the n-channel type TFT to form an LDD region so as not to overlap with the gate electrode in the n-channel type TFT of the pixel matrix circuit.

Then, impurity regions 6036 through 6040 were formed by doping the impurity element giving the n-type. Here, phosphorus was doped by means of ion doping (ion implantation may be also used) by using phosphine ($PH_3$). Here, phosphorus was doped with concentration of $1 \times 10^{20}$ through $1 \times 10^{21}$ atoms/cm$^3$. It is noted that the concentration of the impurity element contained in the impurity regions 6038 through 6040 formed here and giving the n-type will be denoted as (n$^+$). Accordingly, the impurity regions 6038 and 6040 may be said as n$^+$ regions. Further, because the n$^-$ region had been already formed, the impurity regions 6036 and 6037 contain phosphorus with the concentration higher than the impurity regions 6038 through 6040 more or less.

It is noted that the process of doping the impurity element giving the n-type may be carried out after etching the gate insulating film 6007 by using the resist masks 6033 through 6035 and the gate electrode 6031 as masks and exposing the part of the island semiconductor layers 6005 and 6006. In this case, the island semiconductor film is less damaged and the throughput may be improved because the accelerating voltage may be low.

Forming n$^-$ Region: FIG. 15A

Next, resist masks 6033 through 6035 were removed and a process of doping the impurity element giving the n-type to the island semiconductor layer 6006 which turns out to be the n-channel type TFT of the pixel matrix circuit was carried out. Phosphorus of the same or less concentration with the above-mentioned n$^-$ region ($5 \times 10^{16}$ through $5 \times 10^{18}$ atoms/cm$^3$ in concrete) was doped to the impurity regions 6041 through 6044 thus formed. It is noted that the concentration of the impurity element contained in the impurity regions 6041 through 6044 formed here and giving the n-type will be denoted as (n$^-$). Accordingly, the impurity regions 6041 through 6044 may be said as the n$^-$ regions in the present specification. Although the phosphorus is doped to all of the impurity regions except of impurity regions 6068 and 6069 hidden by the gate electrode with the concentration of n$^-$ in this process, it may be neglected because its concentration is very low.

Process of Thermal Activation: FIG. 15B

Next, a protective insulating film 6045 which turns out to be a part of a first interlayer insulating film later was formed. The protective insulating film 6045 may be formed by a silicon nitride film, a silicon oxide film or a silicon nitride oxide film or a laminated film of them. Its thickness may be 100 to 400 nm.

After that, a heat treatment was carried out to activate the impurity element doped with the respective concentration and giving the n-type or p-type. This process may be carried out by means of furnace annealing, laser annealing or rapid thermal annealing (RTA). The activation process was carried out by means of the furnace annealing in this case. The heat treatment was carried out in a nitrogen atmosphere in 300 to 650° C. or preferably in 400 to 550° C., at 450° C. for two hours here.

Further, a heat treatment was carried out for 1 to 12 hours in 300 to 450° C. in an atmosphere containing hydrogen by 3 to 100% to carry out a process of hydrogenating the island semiconductor layer. This process is a step of terminating dangling bonds of the semiconductor layer by the thermally excited hydrogen. Plasma hydrogenation (using hydrogen excited by plasma) may be used as other means of the hydrogenation.

Forming Interlayer Insulating Film, Source/Drain Electrode, Shielding film, Pixel Electrode and Storage Capacitor: FIG. 15C After completing the activation step, an interlayer insulating film 6046 of 0.5 to 1.5 μm thick was formed on the protective insulating film 6045. A laminated film of the protective insulating film 6045 and the interlayer insulating film 6046 was set as a first interlayer insulating film.

After that, contact holes reaching the source or drain regions of the respective TFTs were created to form source electrodes 6047 through 6049 and drain electrodes 6050 and 6051. Although not shown, these electrodes were formed by forming three-layered laminate film of 100 nm of Ti film, 300 nm of aluminum film containing Ti and 150 nm of Ti film continuously by sputtering.

Next, a passivation film 6052 was formed into 50 to 500 nm of thickness (typically 200 to 300 nm) by a silicon nitride film, a silicon oxide film or a silicon nitride oxide film. Then, when a hydrogenation process was carried out in this condition, a result preferable for improving the characteristics of the TFT was obtained. Such result may be obtained by carrying out a heat treatment of 1 to 12 hours in 300 to 450° C. in an atmosphere containing hydrogen by 3 to 100% or by using the plasma hydrogenation. It is noted that an opening may be created through the passivation film 6052 at the position where a contact hole for connecting the pixel electrode with the drain electrode is created later.

After that, a second interlayer insulating film 6053 comprising organic resin was formed into a thickness of about 1

μm. Polyimide, acrylic, polyamide, polyimideamide, BCB (benzocyclobuten) and the like may be used as the organic resin. The use of the organic resin film is advantageous in that the film forming method is simplified, parasitic capacity may be reduced because the dielectric constant is low and it excels in the flatness. It is noted that other organic resin films or organic SiO compound may be used besides those described above. Here, the interlayer insulating film was formed by using polyimide of a thermal polymerization type and by sintering at 300° C. after applying to the active matrix substrate.

Next, a shielding film 6054 was formed on the second interlayer insulating film 6053 in the region which turns out to be the pixel matrix circuit. The shielding film 6054 was a film mainly composed either one of aluminum (Al), titanium (Ti), chromium (Cr) or Tantalum (Ta) and formed into a thickness of 100 to 300 nm. Then, an oxide film 6055 of 30 to 150 nm thick (preferably 50 to 75 nm) was formed on the surface of the shielding film 6054 by anode oxidation or plasma oxidation. Here, an aluminum film or a film mainly composed of aluminum was used as the shielding film 6054 and aluminum oxide film (alumina film) was used as the dielectric 6055.

It is noted that although the dielectric 6055 was provided on the surface of the shielding film here, the dielectric 6055 may be formed by means of vapor phase methods such as plasma CVD, thermal CVD or sputtering. The thickness is preferable to be 30 to 150 nm (or more preferably 50 to 75 nm) also in this case. A silicon oxide film, a silicon nitride film, a silicon nitride oxide film, a DLC (Diamond-Like Carbon) or an organic resin film may be also used. A laminated layer of them may be also used.

Next, a contact hole reaching to a drain electrode 6051 was created through the passivation film 6052 and the second interlayer insulating film 6053 to form pixel electrodes 6056 through 6058. It is noted that pixel electrodes 6057 and 6058 are pixel electrodes of other pixels adjoining to each other, respectively. A transparent conductive film is used for the pixel electrodes 6056 through 6058 in creating a transmission type active matrix liquid crystal display and a metal film is used in creating a reflective type active matrix liquid crystal display. Here, indium tin oxide (ITO) film was formed into a thickness of 100 nm by means of sputtering to create the transmission type active matrix liquid crystal display.

At this time, the storage capacitor was formed at the region 6059 where the pixel electrode 6056 overlaps with the shielding film 6054 via the oxide film 6055.

Thus, the active matrix substrate having the CMOS circuit which turns out to be the driver circuit and the pixel matrix circuit on the same substrate was completed. It is noted that a p-channel type TFT 6081 and an n-channel type TFT 6082 were formed in the CMOS circuit which turns out to be the driver circuit and a pixel TFT 6083 composed of the n-channel type TFT was formed in the pixel matrix circuit.

A channel forming region 6062, a source region 6063 and a drain region 6064 were formed in the p-channel type TFT 6081 of the CMOS circuit as the p$^+$ regions, respectively. A channel forming region 6065, a source region 6066, a drain region 6067 and LDD regions 6068 and 6069 overlapping with the gate electrode (hereinafter referred to as Lov regions, 'ov' means 'overlap') via the gate insulating film were formed in the n-channel type TFT 6082. At:this time, the source region 6066 and the drain region 6067 were formed in the (n$^-$+n$^+$) region and the Lov regions 6068 and 6069 were formed in the n$^-$ region, respectively.

Further, channel forming regions 6070 and 6071, a source region 6072, a drain region 6073 and LDD regions 6074 through 6077 not overlapping with the gate electrode (hereinafter referred to as Loff regions, 'off' means 'offset') via the gate insulating film and an n$^+$ region 6078 in contact with the,Loff regions 6075 and 6076 were formed in the pixel TFT 6083. At this time, the source region 6072 and the drain region 6073 were formed in the n$^+$ region and the Loff regions 6074 through 6077 were formed in the n$^-$ region, respectively.

The length (width) of the Lov region may be set at 0.5 to 3.0 μm or typically 1.0 to 1.5 μm with respect to the channel length of 3 to 7 μm. The length (width) of the Loff regions 6074 through 6077 provided in the pixel TFT 6083 may be set at 0.5 to 3.5 μm, or typically 2.0 to 2.5 μm.

Figure 5:
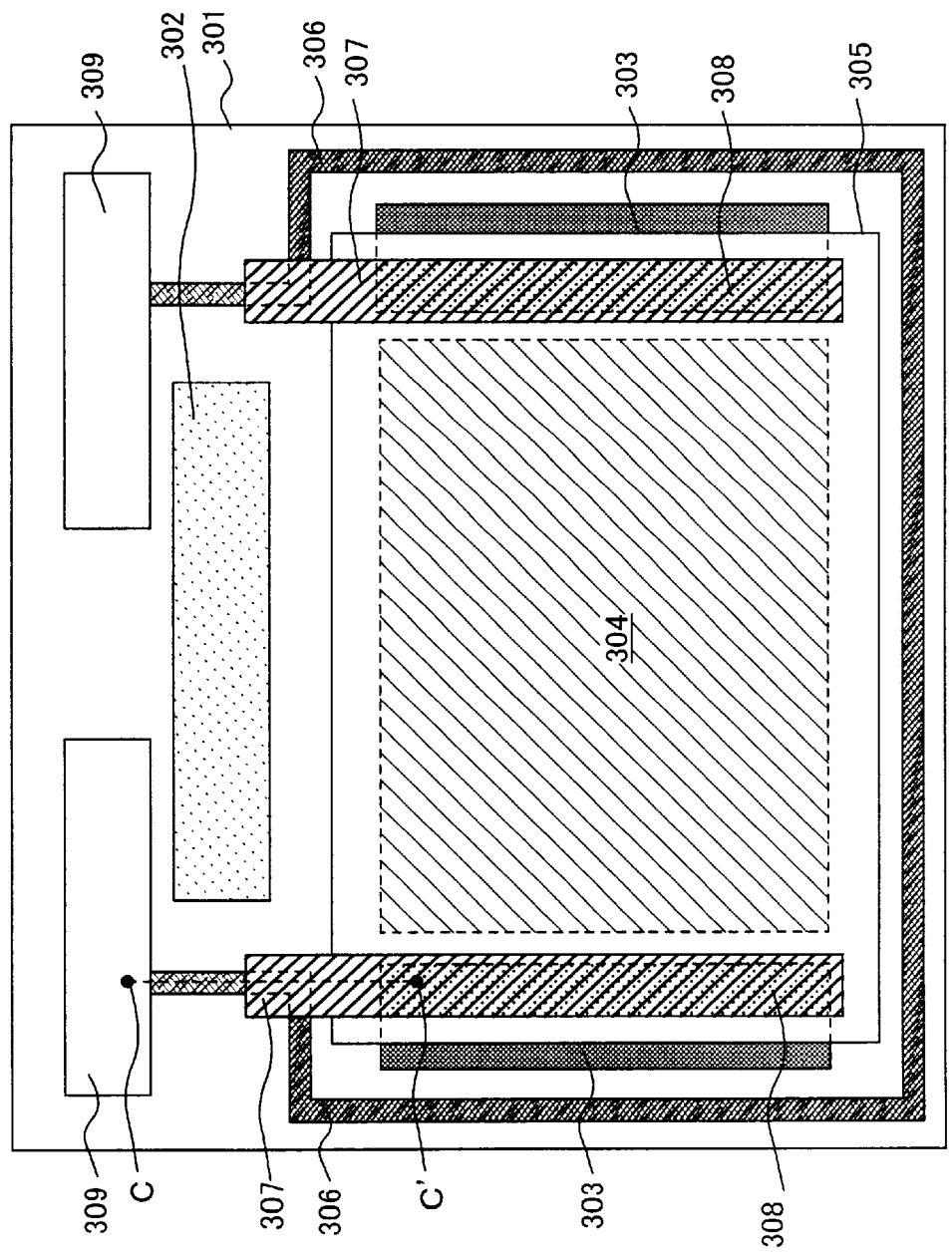
FIG. 5 is an outlined diagram showing the top view of an active matrix liquid crystal display device according to the present invention.
Figure 6:
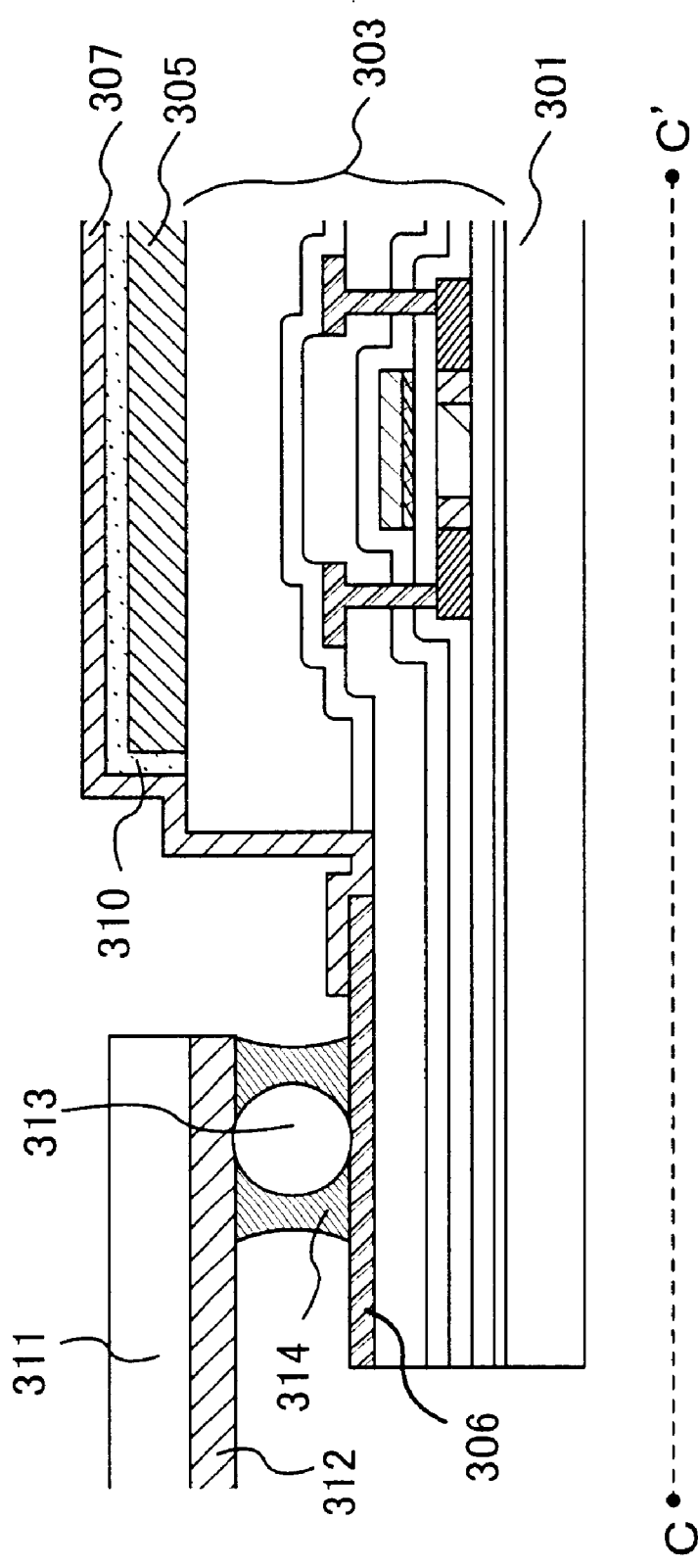
FIG. 6 is a diagram showing a cross section of an active matrix substrate side of an active matrix type liquid crystal device according to the present invention.
Figure 7:
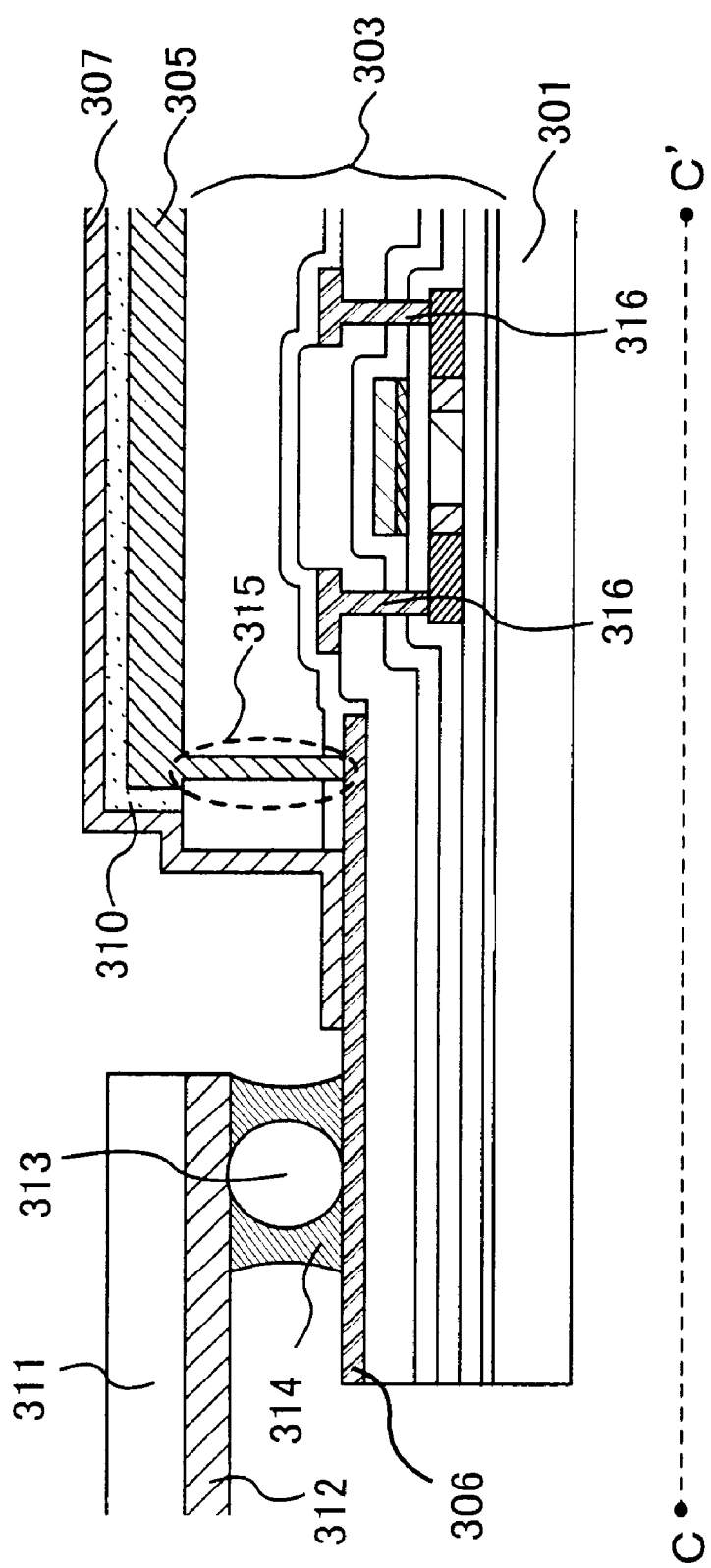
FIG. 7 is a diagram showing a cross section of an active matrix substrate side of an active matrix type liquid crystal device according to the present invention.

The top view and the cross sectional view of the active matrix substrate of an active matrix liquid crystal display device manufactured by the method according to the present Embodiment are shown in FIGS. 5 through 7. FIG. 5 shows a top view, and FIGS. 6 and 7 are a cross section at A–A' in FIG. 5.

Active matrix substrate 301 (6001 in FIG. 13A), source signal line driver circuit 302, gate signal line driver circuit 303, pixel matrix circuit 304, shielding film 305 (6054 in FIG. 15C), ITO wiring 307, common line 306 and FPC 309 are disposed as shown in FIG. 5.

ITO wiring 307 and common line 306 is connected, and the common line 306 is connected to the outside of the substrate through FPC 309 and is held at a fixed electric potential (standard electric potential). A coupling capacitor 308 is formed in the section where ITO wiring 307 that is connected to the common line 306 is disposed over shielding film 305.

FIG. 6 shows a cross section at A–A' in FIG. 5 in the case where the shielding film is floating and a coupling capacitor is FT shown in FIG. 15C, a shielding film 305, a dielectric 310 (6055 in FIG. 15C), ITO wirings 307, a common line 306, a filler 313, resin 314 and an ITO film 312 deposited onto an extraction terminal 311 from FPC are disposed as shown in FIG. 6.

A coupling capacitor is formed by the shielding film 305, the ITO wiring 307 and the dielectric 310 interposed between them. The ITO wirings 307 are provided over the gate signal line driver circuit 303 and are connected to the common line 306. The ITO film 312 is formed on the extraction terminal 311 from FPC in contact with the extraction terminal 311. The ITO film 312 formed on the extraction terminal 311, and common line 306 are connected through the filler 313 and the resin 314.

The resin 314 may be a light curable resin or a heat curable resin, and further, it may be a mixture of a light curable resin and a heat curable resin. In the case where a mixture of a light curable resin and a heat curable resin is used, a connection was made by pressing with heat after temporary adhesion with light. It is necessary that the filler be a conductive material. Two kinds or more of the fillers that differ in size may also be used, and in this case, a smaller filler functions as a spacer and need not be conductive, and a larger particle functions to electrically connect and need to be conductive.

A cross sectional view at A–A' of FIG. 5 is shown in FIG. 7 in case a shielding film is connected to a common line and a coupling capacitor is disposed. The reference numerals are shown by the same number when indicating the same as those shown in FIGS. 5 and 6.

A coupling capacitor is formed by the shielding film 305, the ITO wirings 307 and the dielectric 310 interposed between them. The ITO wirings 307 are provided over the gate signal line driver circuits 303 and are connected to the common line 306. The ITO film 312 is formed on the extraction terminal 311 from FPC in contact with the extraction terminal 311. The ITO film 312 formed on the extraction terminal 311, and the common line 306 is connected through the filler 313 and the resin 314.

The shielding film 305 is connected to the ITO wiring by a contact section 315 as shown in the FIG. 7, and kept at the same electric potential as the common line 306.

Embodiment 2

Besides the method shown in Embodiment 1, another example for fabricating the pixel matrix circuit and the TFTs of the driver circuits provided around that in the same time will be explained with reference to FIGS. 16A to 16C, 17A to 17C and 18A to 18C.

Figure 16A:
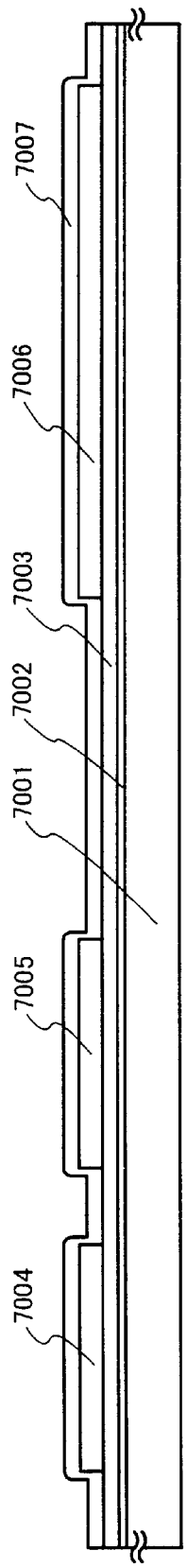
FIGS. 16A to 16C are cross sectional diagrams showing a manufacturing process of thin film transistors of the present invention.

Process for Forming Island Semiconductor Layer and Gate Insulating Film: FIG. 16A In FIG. 16A, it is desirable to use a non-alkali glass substrate or a quartz substrate as an active matrix substrate 7001. Beside them, the substrate may be a silicon substrate or a metal substrate on which an insulating film is formed.

An underlayer film made of a silicon oxide film, a silicon nitride film or a silicon nitride oxide film was formed into a thickness of 100 to 400 nm on the surface of the active matrix substrate 7001 where the TFTs are to be formed by means of plasma CVD or sputtering. The underlayer film may be formed into the double-layer structure of the silicon nitride film 7002 of 25 to 100 nm thick, or 50 nm here, and of the silicon oxide film 7003 of 50 to 300 nm, or 150 nm here. The underlayer film is provided to prevent contamination of impurity from the active matrix substrate and needs not be provided always when the quartz substrate is used.

Next, an amorphous silicon film of 20 to 100 nm thick was formed on the underlayer film by means of publicly known film forming method. Although it depends on the hydrogen content, it is preferable to carry out the crystallization process after reducing the hydrogen content below 5 atomic % by heating several hours preferably in 400 to 550° C. to dehydrogenate it. Although the amorphous silicon film may be formed by another fabrication method such as sputtering or evaporation, it is desirable to sufficiently reduce impurity elements such as oxygen and nitrogen contained in the film. Here, the underlayer film and the amorphous silicon film may be formed continuously because they may be formed by the same film-forming method. It is possible to prevent the contamination of the surface and to reduce the dispersion of characteristics of the fabricated TFTs by not exposing the underlayer film to the atmosphere once after forming it.

The process for forming the crystalline silicon film from the amorphous silicon film may be carried out by using the publicly known laser crystallization or thermal crystallization method. The crystalline silicon film may be fabricated by means of thermal crystallization by using a catalyst element which promote the crystallization of silicon. Besides them, a micro-crystal silicon film may be used or a crystalline silicon film may be directly deposited. The crystalline silicon film may be also formed by using the publicly known technology of SOI (Silicon On Insulators) by which a single crystal silicon is adhered on the substrate.

The island semiconductor layers 7004 through 7006 were formed by etching unnecessary parts of the crystalline silicon film thus formed. Boron (B) may be added at concentration of $1\times10^{15}$ to $5\times10^{17}$ $cm^{-3}$ in advance in order to control threshold voltage in the region of the crystalline silicon film where the n-channel type TFT is to be fabricated.

Next, a gate insulating film 7007 whose main component is silicon oxide or silicon nitride was formed so as to cover the island semiconductor layers 7004 through 7006. The gate insulating film 7007 is formed into a thickness of 10 to 200 nm or more preferably from 50 to 150 nm. For instance, a silicon nitride oxide film whose raw materials are $N_2O$ and $SiH_4$ and whose thickness is 75 nm is formed by means of plasma CVD. Then, it is thermally oxidized in 800 to 1000° C. within oxygen atmosphere or mixed atmosphere of oxygen and hydrochloric acid to form the gate insulating film of 115 nm (FIG. 16A).

Figure 16B:
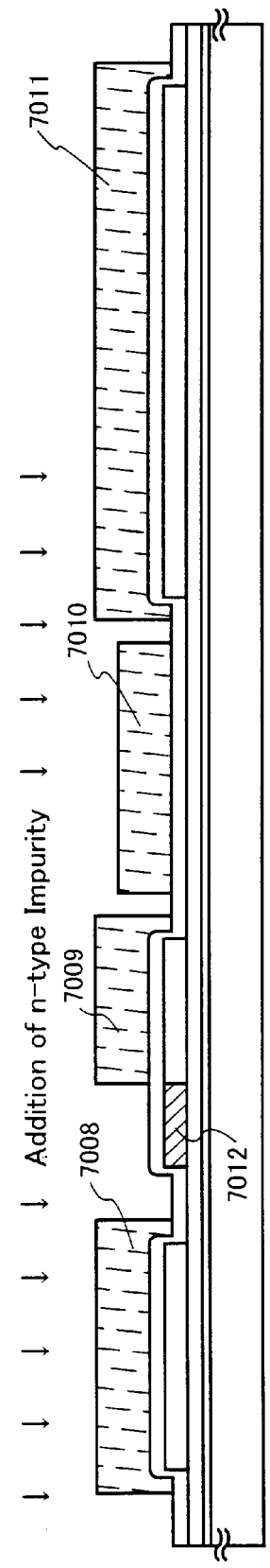

Forming n⁻ Region: FIG. 16B

Resist masks 7008 through 7011 were formed on the whole surface of the region where the island semiconductor layers 7004 and 7006 and the wires are to be formed and at part of the island semiconductor layer 7005 (including the region which turns out to be a channel forming region) and impurity element giving the n-type was added to form a low concentration impurity region 7012. The low concentration impurity region 7012 is an impurity region for forming an LDD region which overlaps with the gate electrode (called Lov region in the present specification. It is noted that 'ov' means 'overlap') via the gate insulating film in the n-channel TFT of the CMOS circuit later. It is noted that the concentration of the impurity element giving the n-type and contained in the low concentrate impurity region will be indicated as (n⁻) here. Accordingly, the low concentrate impurity region 7012 may be said as an n⁻ region within the present specification.

Here, phosphorus was added by means of plasma excited ion doping method without mass-separating phosphine ($PH_3$). The ion plantation which involves the mass-separation may be used. In this process, phosphorus was added to the semiconductor layer under the gate insulating film 7007 via the gate insulating film 7007. Preferably, the concentration of phosphorus to be added was in a range of $5\times10^{17}$ to $5\times10^{18}$ atoms/cm³ and was set at $1\times10^{18}$ atoms/cm³ here.

After that, the resist masks 7008 through 7011 were removed and a thermal treatment of 1 to 12 hours was carried out within an nitrogen atmosphere in 400 to 900° C., or more preferably in 550 to 800° C. to activate the phosphorus added in this step.

Figure 16C:
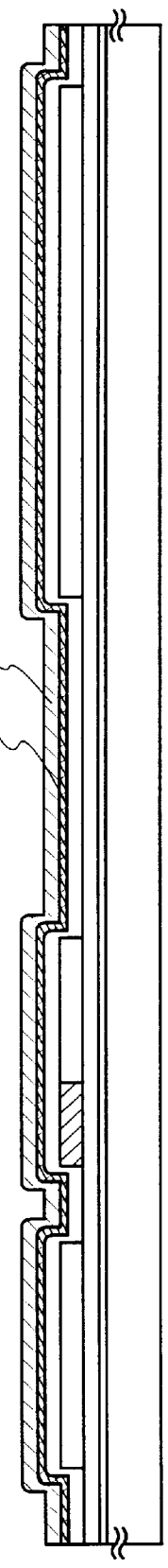

Forming Conductive Film for Gate Electrode and Wire; FIG. 16C

A first conductive film 7013 was formed into a thickness of 10 to 100 nm by a conductive material whose main component is an element selected from titanium (Ti), tantalum (Ta), tungsten (W) and molybdenum (Mo). It is preferable to use tantalum nitride (TaN) or tungsten nitride (WN) for example as the first conductive film 7013. A second conductive film 7014 is then formed into a thickness of 100 to 400 nm by a conductive material mainly composed of either one of elements of Ta, Ti, Mo and W on the first conductive film 7013. For instance, Ta may be formed into a thickness of 200 nm. Although not shown, it is effective to form a silicon film of 2 to 20 nm thick under the first conductive film 7013 to prevent oxidation of the conductive films 7013 and 7014 (the conductive film 7014 in particular).

Forming p-ch Gate Electrode and Wiring Electrode and Forming p⁺⁺ Region: FIG. 17A Resist masks 7015 through 7018 were formed to etch the first and second conductive films (hereinafter handled as a laminated film) to form a gate electrode 7019 and gate signal lines 7020 and 7021 of a p-channel type TFT. It is noted that conductive films 7022 and 7023 were left so as to cover the whole surface of the region which turns out to be the n-channel TFT.

Then, a process of doping impurity elements which give the p-type at part of the semiconductor layer 7004 where the p-channel type TFT is to be formed was carried out by leaving the resist masks 7015 through 7018 as they are as masks. Here, boron was doped as the impurity element by means of ion doping (ion implantation may be also used) by using diboran ($B_2H_6$). Here, boron was doped with concentration of $5 \times 10^{20}$ to $3 \times 10^{21}$ atoms/cm$^3$. It is noted that the concentration of the impurity element contained in the impurity region formed here and giving the p-type will be denoted as (P$^{++}$). Accordingly, the impurity regions 7024 and 7025 may be said as P$^{++}$ regions.

It is noted that the process of doping the impurity element giving the p-type may be carried out after etching the gate insulating film 7007 by using the resist masks 7015 through 7018 and exposing the part of the island semiconductor layer 7004. In this case, the island semiconductor film is less damaged and the throughput may be improved because the accelerating voltage may be low.

Forming n-ch Gate Electrode: FIG. 17B

Next, gate electrodes 7030 and 7031 of the n-channel type TFT were formed by forming resist masks 7026 through 7029 after removing the resist masks 7015 through 7018. At this time, the gate electrode 7030 was formed so as to overlap with the n$^-$ region 7012 via the gate insulating film 7007.

Forming n$^+$ Region: FIG. 17C

Next, the resist masks 7026 through 7029 were removed and resist masks 7032 through 7034 were formed. Then, a process for forming an impurity region which functions as a source or drain region in the n-channel type TFT was carried out. A resist mask 7034 was formed so as to cover the gate electrode 7031 of the n-channel type TFT to form an LDD region so as not to overlap with the gate electrode in the n-channel type TFT of the pixel matrix circuit in the later process.

Then, impurity regions 7035 through 7039 were formed by doping the impurity element giving the n-type. Here, phosphorus was doped by means of ion doping (ion implantation may be also used) by using phosphine (PH$_3$). Here, phosphorus was doped with concentration of $1 \times 10^{20}$ through $1 \times 10^{21}$ atoms/cm$^3$. It is noted that the concentration of the impurity element contained in the impurity regions 7037 through 7039 formed here and giving the n-type will be denoted as (n$^+$). Accordingly, the impurity regions 7037 and 7039 may be said as n$^+$ regions. Further, because the n$^-$ region had been already formed the impurity regions 7035 and 7036 contain phosphorus with the concentration higher than that of the impurity regions 7037 through 7039 more or less.

It is noted that the process of doping the impurity element giving the n-type may be carried out after etching the gate insulating film 7007 by using the resist masks 7032 through 7034 and the gate electrode 7030 as masks and by exposing the part of the island semiconductor layers 7005 and 7006. In this case, the island semiconductor film is less damaged and the throughput may be improved because the accelerating voltage may be low.

Forming n$^{--}$ Region: FIG. 18A

Next, the resist masks 7032 through 7034 were removed and a process of doping the impurity element giving the n-type to the island semiconductor layer 7006 which turns out to be the n-channel type TFT of the pixel matrix circuit was carried out. Phosphorus of the same or less concentration with the above-mentioned n$^{--}$ region ($5 \times 10^{16}$ to $1 \times 10^{18}$ atoms/cm$^3$ in concrete) was doped to the impurity regions 7040 through 7043 thus formed. It is noted that the concentration of the impurity element contained in the impurity regions 7040 through 7043 formed here and giving the n-type will be denoted as (n$^{--}$). Accordingly, the impurity regions 7040 through 7043 may be said as then n$^{--}$ regions in the present specification. Although the phosphorus is doped to all of the impurity regions except of an impurity region 7067 hidden by the gate electrode with the concentration of n in this process, it may be neglected because its concentration is very low.

Process of Thermal Activation: FIG. 18B

Next, a protective insulating film 7044 which turns out to be a part of a first interlayer insulating film later was formed. The protective insulating film 7044 may be formed by a silicon nitride film, a silicon oxide film or a silicon nitride oxide film or a laminated film of them. Its thickness may be 100 to 400 nm.

After that, a heat treatment was carried out to activate the impurity element doped with the respective concentration and giving the n-type or p-type. This process may be carried out by means of furnace annealing, laser annealing or rapid thermal annealing (RTA). The activation process was carried out by means of the furnace annealing in this case. The heat treatment was carried out in a nitrogen atmosphere in 300 to 650° C. or preferably in 400 to 550° C., and here at 450° C. here for two hours.

Further, a heat treatment was carried out for 1 to 12 hours in 300 to 450° C. in an atmosphere containing hydrogen by 3 to 100% to carry out a process of hydrogenating the island semiconductor layer. This process is a step of terminating dangling bonds of the semiconductor layer by the thermally excited hydrogen. Plasma hydrogenation (using hydrogen excited by plasma) may be used as other means of the hydrogenation.

Forming Interlayer Insulating Film, Source/Drain Electrode, Shielding film, Pixel Electrode and Storage capacitor: FIG. 18C After ending the activation step, an interlayer insulating film 7045 of 0.5 to 1.5 $\mu$m thick was formed on the protective insulating film 7044. A laminated film composed of the protective insulating film 7044 and the interlayer insulating film 7045 was set as a first interlayer insulating film.

After that, contact holes reaching the source or drain regions of the respective TFTs were created to form source electrodes 7046 through 7048 and drain electrodes 7049 and 7050. Although not shown, these electrodes were formed by forming three-layered laminate film of 100 nm of Ti film, 300 nm of aluminum film containing Ti and 150 nm of Ti film continuously by sputtering.

Next, a passivation film 7051 was formed into 50 to 500 nm of thickness (typically 200 to 300 nm) by a silicon nitride film, a silicon oxide film or a silicon nitride oxide film. Then, when a hydrogenation process was carried out in this condition, a result preferable for improving the characteristics of the TFT was obtained. Such result may be obtained by carrying out a heat treatment of 1 to 12 hours in 300 to 450° C. in an atmosphere containing hydrogen by 3 to 100% or by using the plasma hydrogenation. It is noted that an opening may be created through the passivation film 7051 at the position where a contact hole for connecting the pixel electrode with the drain electrode later is created.

After that, a second interlayer insulating film 7052 made of organic resin was formed into a thickness of about 1 $\mu$m. Polyimide, acrylic, polyamide, polyimideamide, BCB (benzocyclobuten) and the like may be used as the organic resin. The use of the organic resin film is advantageous in that the film forming method is simplified, parasitic capacity may be reduced because the dielectric constant is low and it excels in the flatness. It is noted that other organic resin films or organic SiO compounds may be used besides those described above. Here, the interlayer insulating film was formed by using polyimide of a thermal polymerization type and by sintering at 300° C. after applying to the active matrix substrate.

Next, a shielding film 7053 was formed on the second interlayer insulating film 7052 in the region which turns out to be the pixel matrix circuit. The shielding film 7053 was a film mainly composed either one of aluminum (Al), titanium (Ti), chromium (Cr) or Tantalum (Ta) and formed into a thickness of 100 to 300 nm. Then, an oxide film 7054 of 30 to 150 nm thick (preferably 50 to 75 nm) was formed on the surface of the shielding film 7053 by anode oxidation or plasma oxidation. Here, an aluminum film or a film mainly composed of aluminum was used as the shielding film 7053 and aluminum oxide film (alumina film) was used as the dielectric 7054.

It is noted that although the dielectric 7054 was provided on the surface of the shielding film here, the dielectric may be formed by means of vapor phase methods such as plasma CVD, thermal CVD or sputtering. The thickness is preferable to be 30 to 150 nm (or more preferably 50 to 75 nm) also in this case. A silicon oxide film, a silicon nitride film, a silicon nitride oxide film, a DLC (Diamond-Like Carbon) or an organic resin film may be also used. A laminated layer of them may be also used.

Next, a contact hole reaching to a drain electrode 7050 was created through the second interlayer insulating film 7052 and passivation film 7051 to form a pixel electrode 7055 through 7057. It is noted that pixel electrodes 7056 and 7057 are pixel electrodes of other pixels adjoining to each other, respectively. A transparent conductive film is used for the pixel electrodes 7055 through 7057 in creating a transmission type active matrix liquid crystal display and a metal film is used in creating a reflective type active matrix liquid crystal display. Here, an indium tin oxide (ITO) film was formed into a thickness of 100 nm by means of sputtering to create the transmission type active matrix liquid crystal display.

At this time, the storage capacitor was formed at the region 7058 where the pixel electrode 7055 overlaps with the shielding film 7053 via the dielectric 7054 in other words, a region 7058 where the shielding film 7053 is formed over the pixel electrode 7055 by interposing the dielectric 7054.

Thus, the active matrix substrate having the CMOS circuit which turns out to be the driver circuit and the pixel matrix circuit oh the same substrate was completed. It is noted that a p-channel type TFT 7081 and an n-channel type TFT 7082 were formed in the CMOS circuit which turns out to be the driver circuit and a pixel TFT 7083 composed of the n-channel type TFT was formed in the pixel matrix circuit.

A channel forming region 7061, a source region 7062 and a drain region 7063 were formed in the p-channel type TFT 7081 of the CMOS circuit as the p$^+$ regions, respectively. A channel forming region 7064, a source region 7065, a drain region 7066 and a LDD region 7067 overlapping with the gate electrode (hereinafter called as Lov region, 'ov' means 'overlap') via the gate insulating film 7007 were formed in the n-channel type TFT 7082. At this time, the source region 7065 and the drain region 7066 were formed in the (n$^-$+n$^+$) region and the Lov region 7067 was formed in the n$^-$ region, respectively.

Further, channel forming regions 7068 and 7069, a source region 7070, a drain region 7071 and LDD regions 7072 through 7075 not overlapping with the gate electrode (hereinafter called as Loff regions, 'off' means' 'offset') via the gate insulating film 7007 and an n+region 7076 in contact with the Loff regions 7073 and 7074 were formed in the pixel TFT 7083. At this time, the source region 7070 and the drain region 7071 were formed in the n+ region and the Loff regions 7072 through 7075 were formed in the n$^{--}$ region, respectively.

The length (width) of the Lov region may be set at 0.5 to 3.0 μm or typically 1.0 to 1.5 μm with respect to the channel length of 3 to 7 μm. The length (width) of the Loff regions 7072 through 7075 provided in the pixel TFT 7083 may be set at 0.5 to 3.5 μm, or typically at 2.0 to 2.5 μm.

Embodiment 3

Besides the method shown in the first embodiment, one example of the method for fabricating the inventive TFTs of the pixel matrix circuit and the driver circuits provided around it in the same time will be explained with reference to FIGS. 19A to 19D. It is noted that the method for fabricating the present invention is not limited to this fabrication method. This Embodiment is also applicable to Embodiment 2.

Figure 13C:
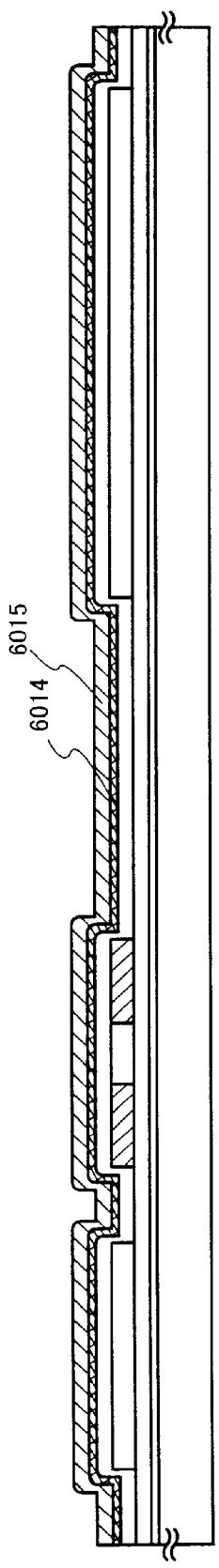
Figure 19A:
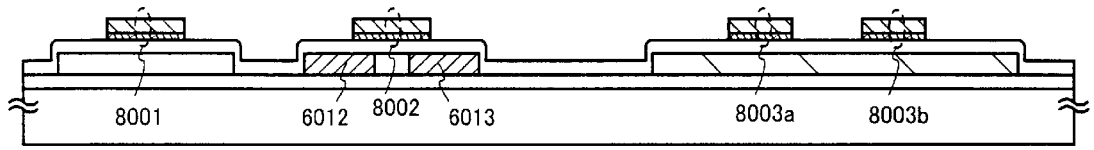
FIGS. 19A to 19E are cross sectional diagrams showing a manufacturing process of thin film transistors of the present invention.

The device is formed in the same manner with the Embodiment 1 up to the step shown in FIG. 13C. Next, the first and second conductive films (handled as a laminated layer herein below) are etched by using resist masks to form a gate electrode 8001 of the p-channel type TFT and a gate electrode 8002, gate signal lines 8003a and 8003b of the n-channel type TFT. At this time, the gate electrode 8002 is formed so as to overlap with the n$^-$ regions 6012 and 6013 via a gate insulating film (FIG. 19A).

Figure 19B:
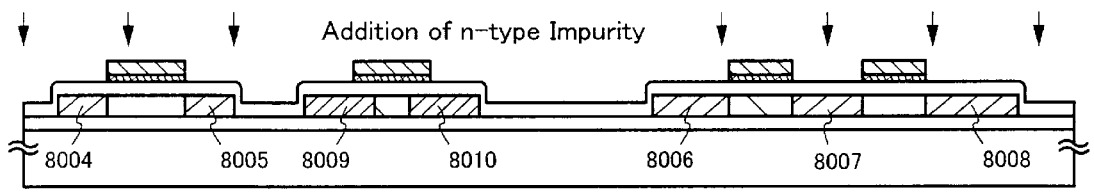

Then, impurity element giving the n-type was doped by using the gate electrode 8001 of the p-channel type TFT, the gate electrode 8002 and the gate signal line 8003a and 8003b of the n-channel type TFT as masks. Phosphorus of the same or less concentration with n$^-$ region mentioned in FIG. 14B ($5\times10^{16}$ to $1\times10^{18}$ atoms/cm$^3$ in concrete) was doped to the impurity regions 8004 through 8008 thus formed. It is noted that the concentration of the impurity element contained in the impurity regions 8004 through 8008 formed here and giving the n-type will be denoted as a (n$^{--}$) region. Accordingly, the impurity regions 8004 through 8008 may be said as the n$^{--}$ regions in the present specification. Although the phosphorus is doped to all of the impurity regions except of impurity regions 8009 and 8010 hidden by the gate electrode with the concentration of n$^{--}$ in this process, it may be neglected because its concentration is very low (FIG. 19B).

Next, resist masks 8011 through 8014 were formed. Then, a step of forming an impurity region which functions as a source region or a drain region in the n-channel type TFT was carried out. The resist mask 8012 was formed so as to cover the gate electrode 8002 of the n-channel type TFT in order to form an LDD region so as not to overlap with the gate electrode in the n-channel type TFT of the pixel matrix circuit in the later step.

Figure 19C:
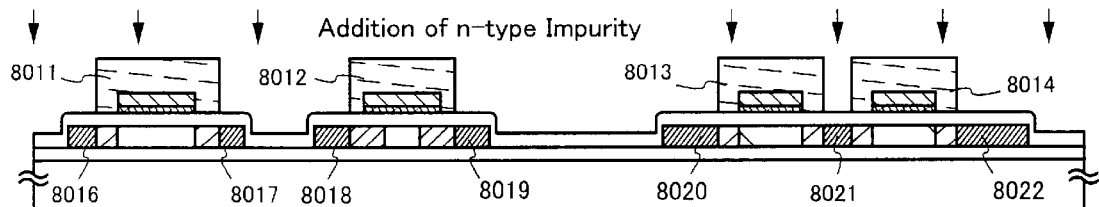

Then, impurity regions 8016 through 8022 were formed by doping the impurity element giving the n-type. Here, phosphorus was doped by means of ion doping (ion implantation may be also used) by using phosphine (PH$_3$) also here. Here, phosphorus was doped with concentration of $1\times10^{20}$ to $1\times10^{21}$ atoms/cm$^3$. It is noted that the concentration of the impurity element contained in the impurity regions 8018 through 8022 formed here and giving the n-type will be denoted as (n$^+$). Accordingly, the impurity regions 8018 through 8022 may be said as n$^+$ regions. Further, because the n$^-$ region had been already formed, the impurity regions 8009 and 8010 contain phosphorus with the concentration higher than the impurity regions 8020 through 8022 more or less (FIG. 19C).

It is noted that the process of doping the impurity element giving the n-type may be carried out after etching the gate insulating film 6007 by using the resist masks 8011 through 8014 as masks and by exposing the part of the island semiconductor layers 6005 and 6006. In this case, the island semiconductor film is less damaged and the throughput may be improved because the accelerating voltage may be low.

Figure 19D:
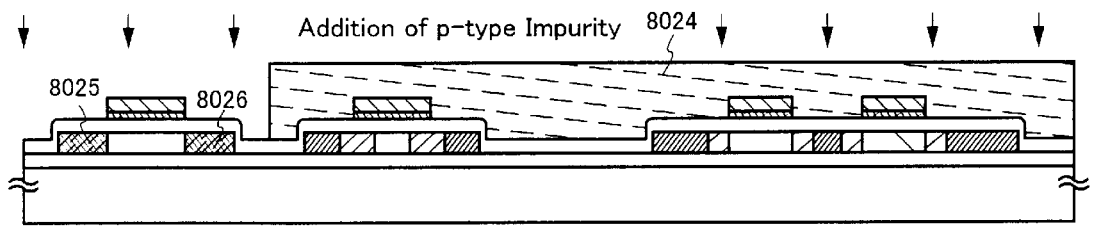

A resist mask 8024 was formed so as to cover the whole surface of the region which turns out to be the n-channel type TFT. Then, a process of doping impurity elements which give p-type at part of the semiconductor layer 6004 where the p-channel type TFT is to be formed was carried out with resist mask 8024 used as a mask. Here, boron was doped as the impurity element by means of ion doping (ion implantation may be also used) by using diborane ($B_2H_6$). Here, boron was doped with concentration of $5 \times 10^{20}$ to $3 \times 10^{21}$ atoms/cm$^3$. It is noted that the concentration of the impurity element contained in the impurity region formed here and giving the p-type will be denoted as ($P^+$). Accordingly, the impurity regions 8025 and 8026 may be said as $P^+$ regions (FIG. 19D).

It is noted that the process of doping the impurity element giving the p-type may be carried out after etching the gate insulating film 6007 by using the resist mask 8024 to expose the part of the island semiconductor layer 6004. In this case, the island semiconductor film is less damaged and the throughput may be improved because the accelerating voltage may be low.

Figure 19E:
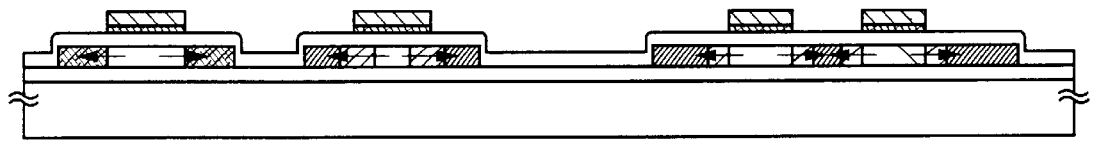

Next, a step for activating the doped impurity element (phosphorus or boron) is carried out. Preferably, this activating process is carried out by means of furnace annealing or lamp annealing in the present embodiment. When the furnace annealing is used, a heat treatment is carried out in 450 to 650° C. or more preferably in 500 to 550° C. or here at 500° C. of four hours (FIG. 19E).

In case of the present embodiment, there always exists a region containing certain concentration of phosphorus equivalent to that of the n$^+$ region in the source or drain region of the both n-channel type TFT and p-channel type TFT. Therefore, if the silicon film is initially crystallized by using a crystallization promoting metal such as nickel, it is possible to obtain a nickel gettering effect by phosphorus in the heat treatment step for the thermal activation. That is, nickel moves in the direction indicated by an arrow from the channel forming region and is gettered by the action of phosphorus contained in the source or drain region.

The present embodiment is effective in simplifying the process because the step for activating the impurity element doped to the island semiconductor film may be combined with the step for gettering the catalyst element used for crystallization.

Then, the TFTs of the pixel matrix circuit and the driver circuits provided around that are completed through the same process shown in FIG. 15B as described in the Embodiment 1. It is noted that the present embodiment shows mere examples of the fabrication processes and the sequence of the fabrication processes is not limited to the mode of the present embodiment.

Embodiment 4

Figure 20:
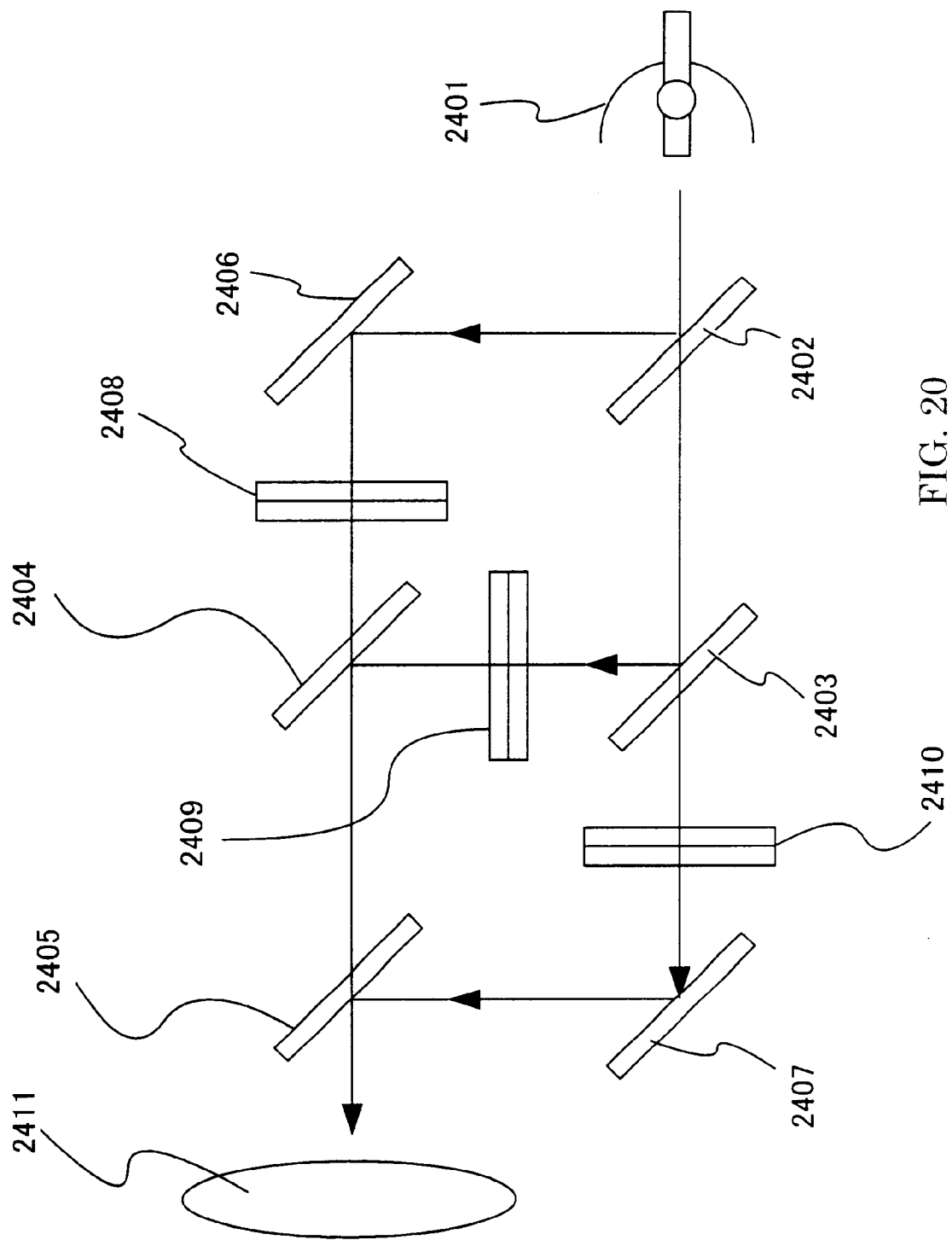
FIG. 20 is an outlined structure diagram of three-plate type projector using an active matrix liquid crystal display device of the present invention.

The inventive liquid crystal display explained. in the first through third embodiments may be used for a three-plate type projector as shown in FIG. 20.

In FIG. 20, the reference numeral (2401) denotes a white light source, (2402 through 2405) dichroic mirrors, (2406 and 2407) total reflection mirrors, (2408 through 2410) active matrix liquid crystal displays of the invention and (2411) a projector lens.

Embodiment 5

Figure 21:
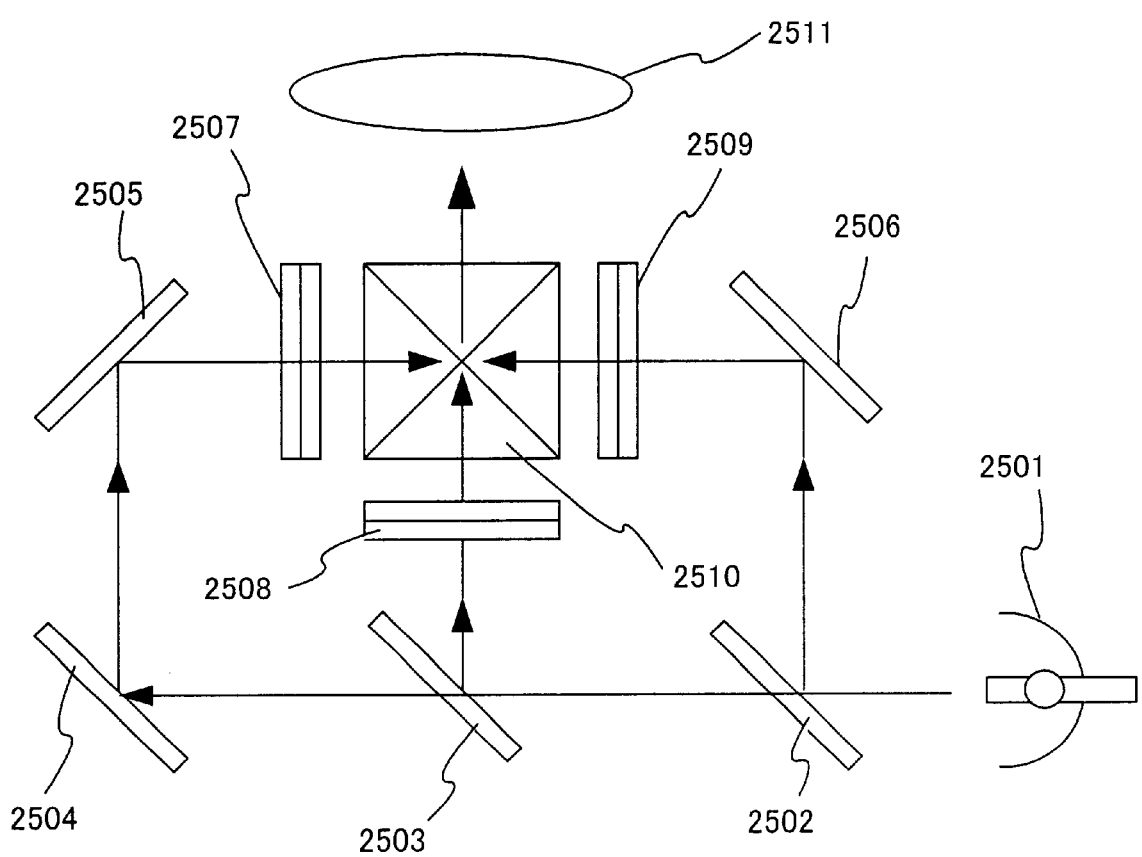
FIG. 21 is an outlined structure diagram of three-plate type projector using an active matrix liquid crystal display device of the present invention.

The inventive active matrix liquid crystal display explained in the first through third embodiments may be used also for a three-plate type projector as shown in FIG. 21.

In FIG. 21, the reference numeral (2501) denotes a white light source, (2502 through 2503) dichroic mirrors, (2504 and 2506) total reflection mirrors, (2507 through 2509) active matrix liquid crystal displays of the invention, (2510) a dichroic prism and (2511) a projector lens.

Embodiment 6

Figure 22:
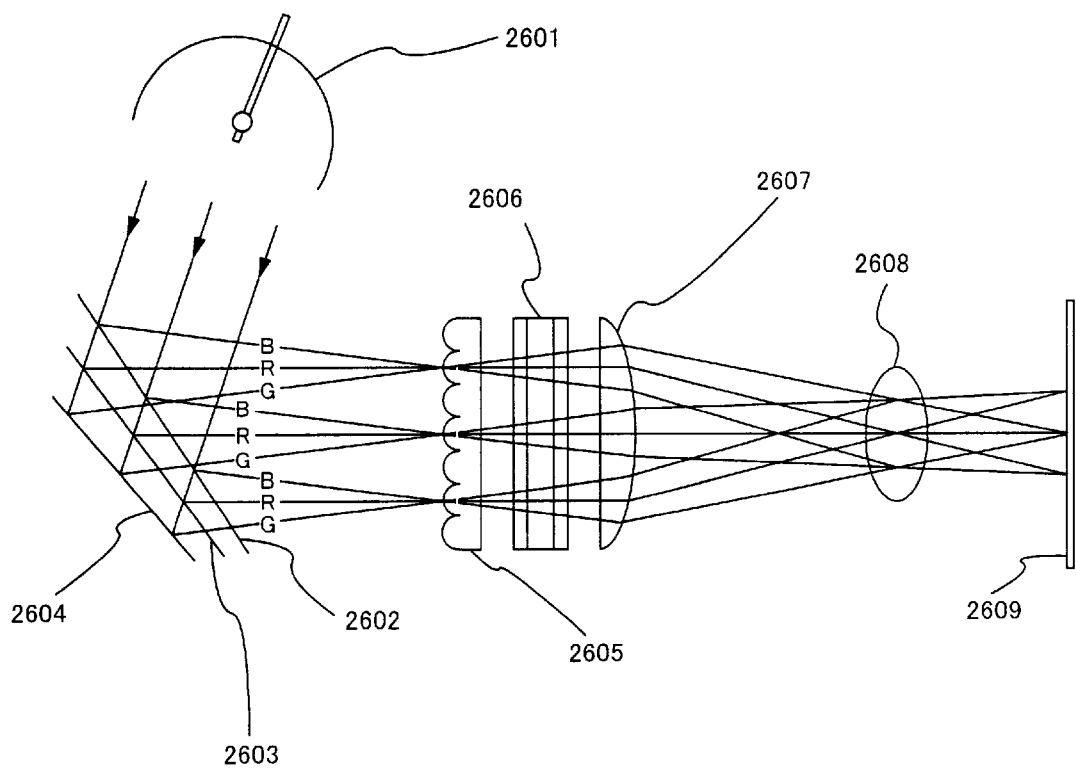
FIG. 22 is an outlined structure diagram of single-plate type projector using an active matrix liquid crystal display device of the present invention.

The inventive active matrix liquid crystal display explained in the Embodiments 1 through 3 may be used also for a single-plate type projector as shown in FIG. 22.

In FIG. 22, the reference numeral (2601) denotes a white light source composed of a lamp and a reflector, (2602, 2603 and 2604) dichroic mirrors for selectively reflecting light in the wavelength ranges of blue, red and green, respectively, (2605) a micro-lens array comprising a plurality of micro-lenses, (2606) an active matrix liquid crystal display of the invention, (2607) a field lens, (2608) a projector lens and (2609) a screen.

Embodiment 7

Among the projectors in the Embodiments 5 through 7, there are a rear projector and a front projector depending on its projecting method.

Figure 23A:
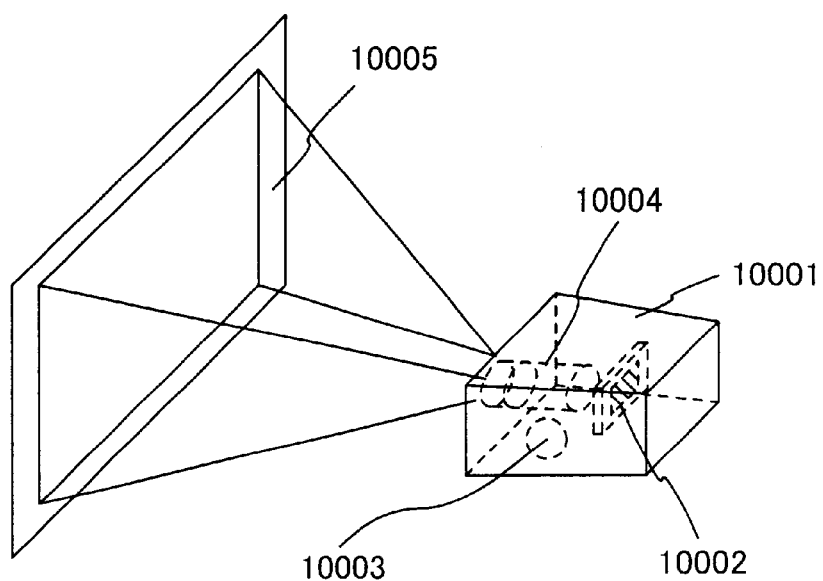
FIGS. 23A and 23B are outlined structure diagrams of a front type projector and a rear type projector using an active matrix liquid crystal display device of the present invention.

FIG. 23A shows the front type projector comprising a main body 10001, an active matrix liquid crystal display 10002 of the invention, a light source 10003, an optical system 10004 and a screen 10005. It is noted that although FIG. 23A shows the front projector in which the active matrix liquid crystal display is built in, a front type projector of higher resolution and higher precision may be realized by combining three active matrix liquid crystal displays (corresponding to light of R, G and B, respectively).

Figure 23B:
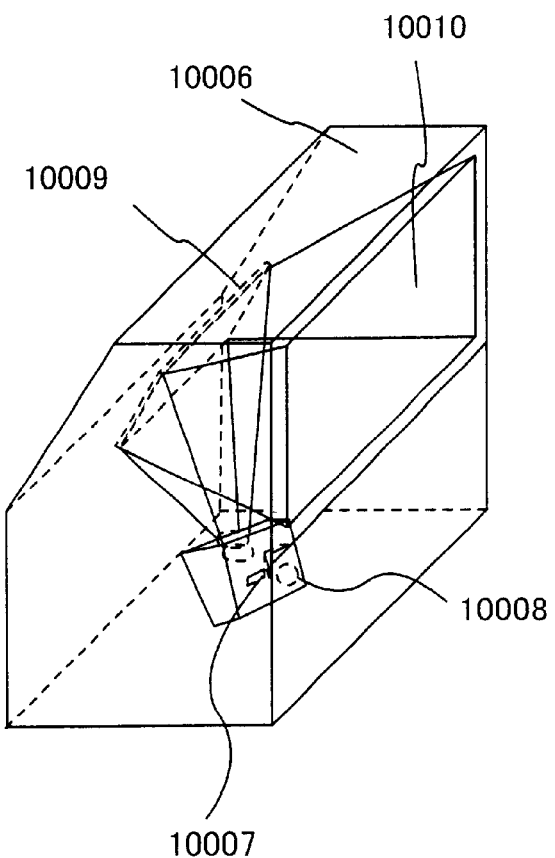

FIG. 23B shows the rear type projector comprising a main body 10006, an active matrix liquid crystal display 10007 of the invention, a light source 10008, a reflector 10009 and a screen 10010. FIG. 23B shows the rear projector in which three active matrix liquid crystal displays are built in (corresponding to light of R, G and B, respectively).

Embodiment 8

An example in which the inventive active matrix liquid crystal display is used for a goggle type display will be explained in the present embodiment.

Figure 24:
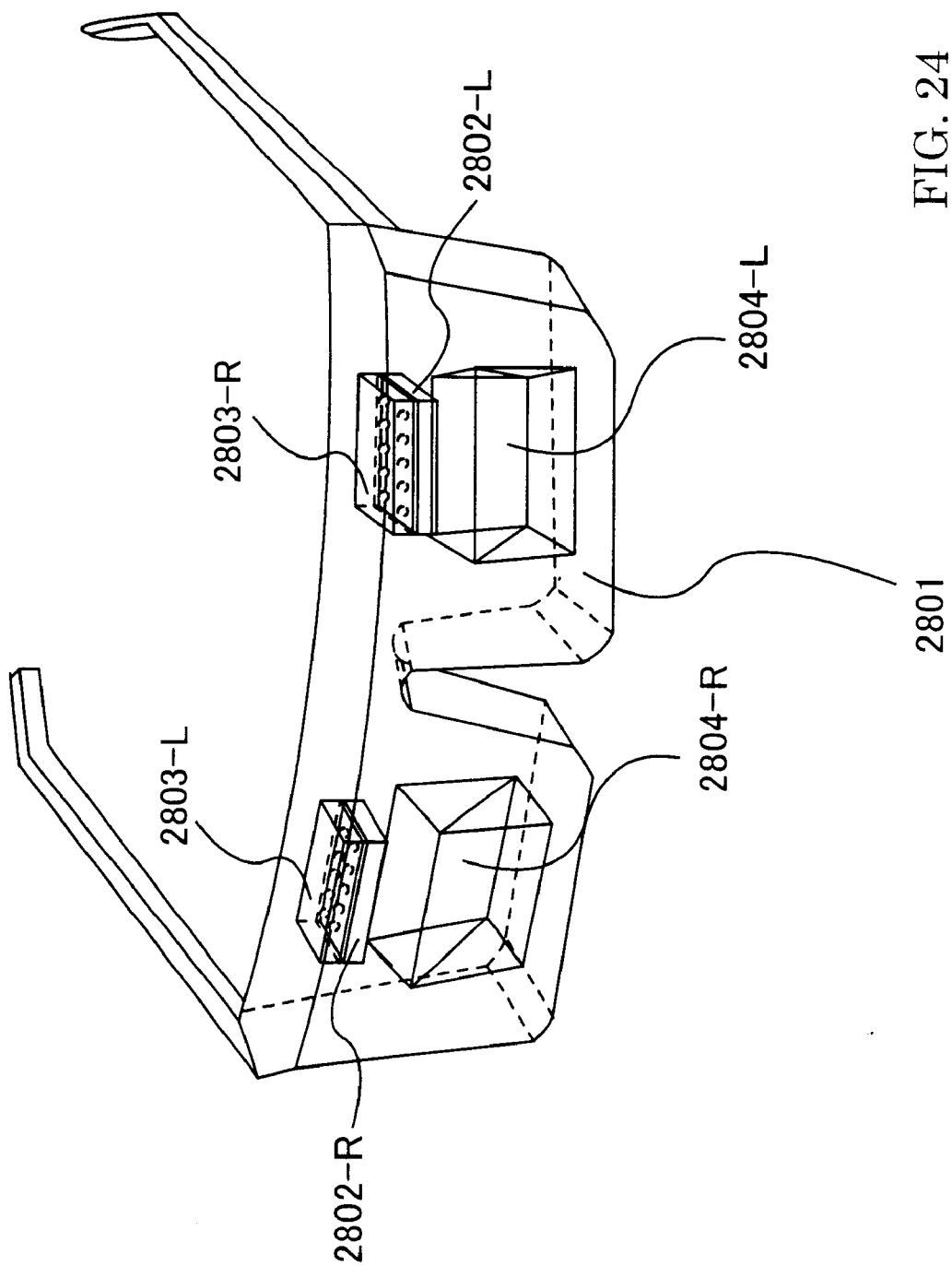
FIG. 24 is an outlined structure diagram of a goggle type display using an active matrix liquid crystal display of the present invention.

In FIG. 24, the reference numeral (2801) denotes a main body of the goggle type display, (2802-R and 2802-L) the inventive liquid crystal displays, (2803-R and 2803-L) LED back lights, and (2804-R and 2804-L) optical elements.

Note that the present Embodiment is freely combinable with Embodiment 1 through 3.

Embodiment 9

Besides those described above, the inventive active matrix liquid crystal display may be used variously. A semiconductor device in which the inventive active matrix liquid crystal display is built in will be explained in the present embodiment.

Such semiconductor device includes a video camera, a still camera, a car-navigation system, a personal computer, a portable information terminal (mobile computer, portable phone and others) and others. FIGS. 25A through 25D show examples of them.

FIG. 25A shows a portable phone comprising a main body 11001, a speech output section 11002, a speech input section 11003, an inventive active matrix liquid crystal display 11004, control switches 11005 and an antenna 11006.

FIG. 25B shows a video camera comprising a main body 12001, an inventive active matrix liquid crystal display 12002, a sound input section 12003, control switches 12004, a battery 12005 and an image receiving section 12006.

FIG. 25C shows a mobile computer comprising a main body 13001, a camera section 13002, an image receiving section 13003, a control switch 13004 and an inventive active matrix liquid crystal display 13005.

FIG. 25D shows a portable book (electronic book) comprising a main body 14001, inventive active matrix liquid crystal displays 14002 and 14003, a storage medium 14004, control switches 14005 and an antenna 14006.

Note that the present Embodiment is freely combinable with Embodiments 1 through 3.

Embodiment 10

Figure 26:
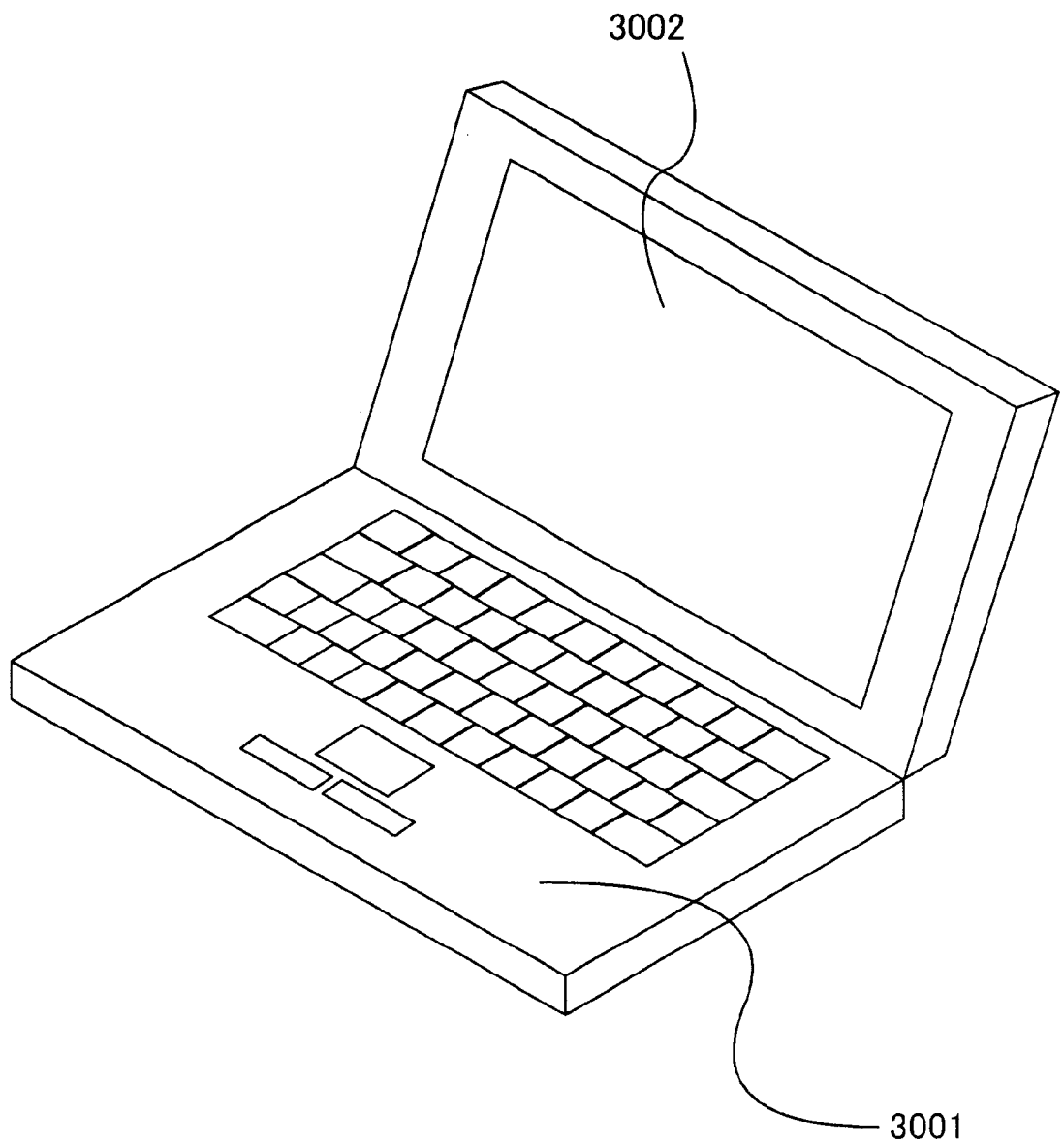
FIG. 26 is an outlined structure diagram of a notebook type personal computer using an active matrix liquid crystal display device of the present invention.

FIG. 26 shows an example in which the inventive liquid crystal display is used in a notebook type personal computer.

The notebook type personal computer comprises a main body 3001 and an active matrix liquid crystal display 3002 of the invention. LED is used for backlight. It is noted that a cathode ray tube may be also used for backlight.

Note that the present Embodiment is freely combinable with Embodiments 1 through 3.

Embodiment 11

Figure 27A:
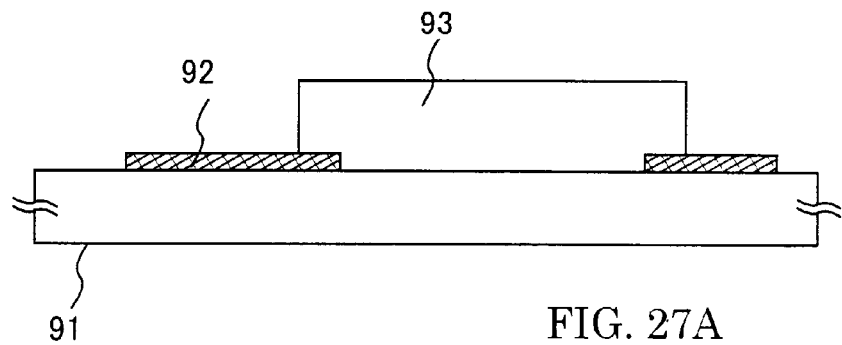
FIGS. 27A to 27C show a manufacturing process of an opposing substrate.
Figure 27B:
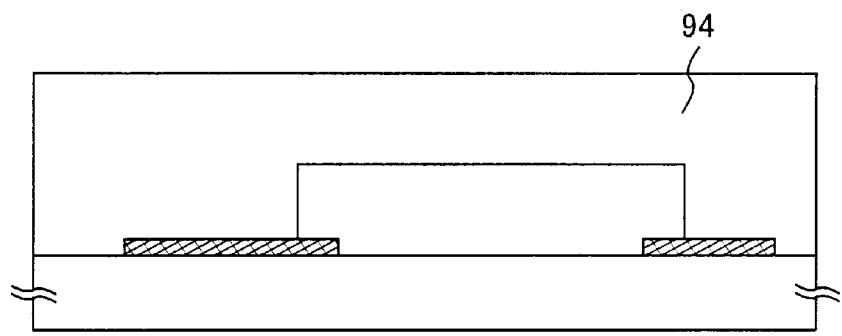
Figure 27C:
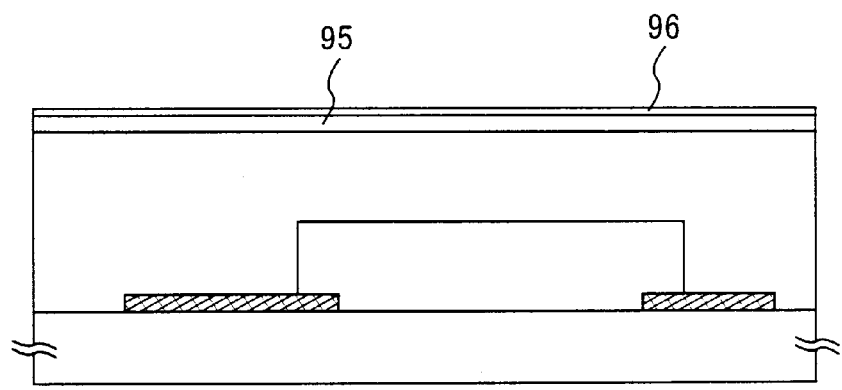

Details of manufacturing process for providing an opposing shielding film on the opposing substrate is described in the Embodiment 11 using FIGS. 27A through 27C.

To start with, black matrix 92 is formed on the opposing substrate 91 to a thickness of 1000–2000 Å as shown in FIG. 27A.

This black matrix 92 is disposed to a region that will face the driver circuit section where driver circuits are disposed on the active matrix substrate, when later assembled as a cell. As mentioned before, a film comprising aluminum (Al), titanium (Ti), chromium (Cr) or tantalum (Ta) or a film comprising a resin with dispersed black pigments may be used as black matrix 92.

Next, color filter 93 is fabricated when it is necessary to display the image in colors. The color filter is required to have a uniform thickness and flatness, and to excel in heat resistance and chemical resistance. (FIG. 27A)

Color filter 93 is formed by a publicly known structure. That is, a structure in which R (red), G (green) and B (blue) are regularly disposed on the regions of the opposing substrate 91 corresponding to each pixel electrode of the active matrix substrate. The thickness of the color filter may be set at 1.5–2.0 μm.

Therefore, though the color filter 93 shown in FIG. 27A is indicated as if it were a single film, it is in fact a group of patterns comprising color filters corresponding to R (red), G (green) and B (blue).

Next, a planarization film 94 comprising a transmittable resin material is deposited to a thickness of 2.0–3.0 μm by covering black matrix 92 and color filter 93. The planarization film 94 also has a function as a protective film protecting the color filter. (FIG. 27B)

An opposing electrode 95 comprising a transparent conductive film is formed to a thickness of 1000 Å over the planarization film 94. By forming an alignment layer 96 over the opposing electrode 95 at 800 Å, an opposing substrate as shown in FIG. 27C is completed.

Note that Embodiment 11 is freely combinable with Embodiment 1 through 10.

Embodiment 12

A summary of cell assembly process to finish an active matrix liquid crystal display device is described by using FIGS. 28A through 28D.

Figure 28A:
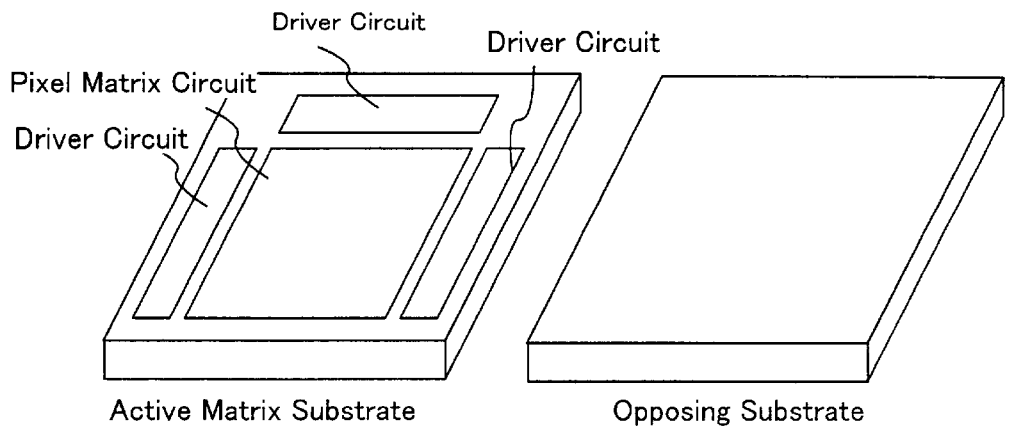
FIGS. 28A to 28D show outline of the cell assembly process.

After finishing an active matrix substrate and an opposing substrate by going through the processes described in Embodiment 1–3 and 11, a rubbing treatment is next carried out onto the both substrates to give a desired orientation on the alignment film. By this process, orientation of the liquid crystal material near the substrate is determined. (FIG. 28A)

Sealant 41 is formed by screen-printing method to enclose driver circuit and pixel matrix circuit after the rubbing treatment. Epoxy resin and phenol curing agent dissolved in a solvent of ethyl-cellosolve can be used for sealant 41. An opening (liquid crystal injection hole) may be formed in the sealant 41 for later injecting a liquid crystal material.

The effect of this sealant 41 is not only adhering the substrates but also preventing the liquid crystal material from leaking by sealing the liquid crystal at the section around the image display region.

Figure 28B:
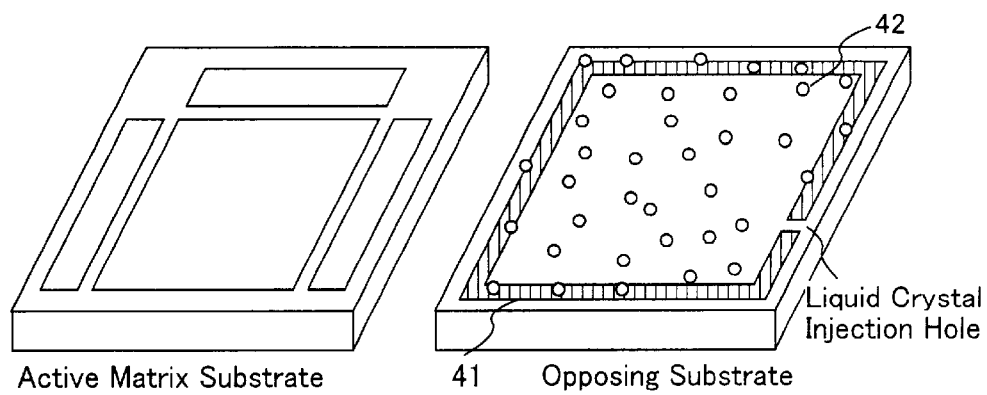

Next, spacers 42 are sprayed on the opposing substrate. As spacers 42, sphere shaped micro grains of a polymer type, a glass type or a silica type may be used, and they are spread over the whole surface of the active matrix substrate by spraying from a nozzle. (FIG. 28B)

As an advantage of performing the above stated sealant and spacer applying process on the opposing substrate side is given in preventing contamination of TFT circuits and preventing destruction by static electricity. Specifically, since a process for spacers spraying generates static electricity, it is preferable to perform the process on the opposing substrate side.

Figure 28C:
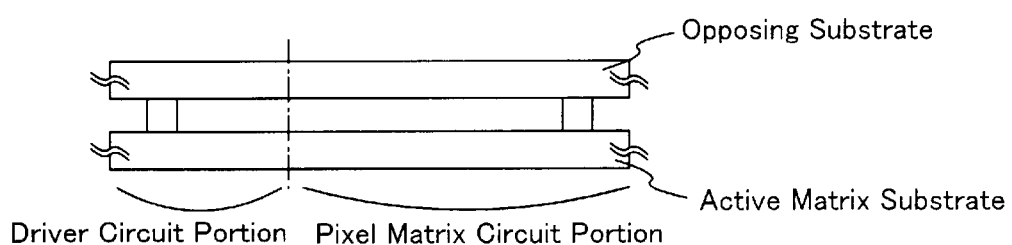
Figure 28D:
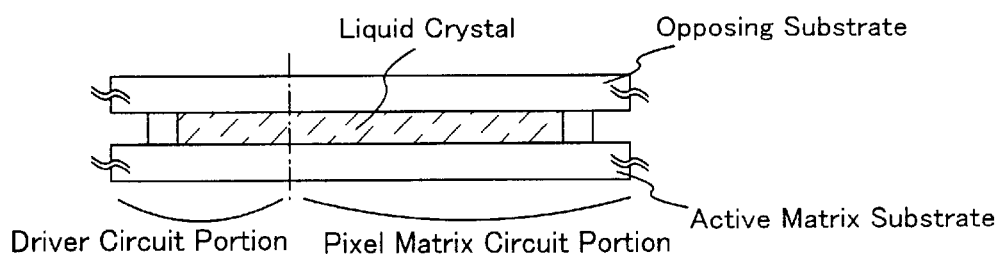

Next, bonding of the active matrix substrate and the opposing substrate is conducted. The length L shown in FIG. 1B that should be kept in advance (margin for alignment) may be determined by the alignment precision. In alignment, both substrates are placed so as to sandwich the spacers 42, and the cell gap (distance between the substrates) will be determined by a diameter of the spacer 42. It is preferable to hold a cell gap of 1 to 2 μm, typically 1.5 μm when using smetic liquid crystal. When using nematic liquid crystal, distance of 3 to 5 μm, typically 1.5 μm is preferable. (FIG. 28C)

After finishing alignment of the active matrix substrate and the opposing substrate, liquid crystal is injected from an opening formed in advance in the sealant 41, and a state in which liquid crystal is held in the pixel section is made. Injection of liquid crystal may employ a publicly known method of vacuum injection method.

Finally the liquid crystal is sealed by sealing the opening, and a liquid crystal display device shown in 28D is finished. Black matrix disposed in this liquid crystal display device is disposed on the active matrix substrate side in the pixel section, and on the opposing substrate side in the driver circuit.

Note that embodiment 12 can be freely combined with embodiments 1 to 11.

Embodiment 13

An example of fabricating TFTs of a pixel matrix circuit and a driver circuit formed in peripheral of the pixel matrix circuit at the same time according to another method of the present invention than embodiments 1 and 2 is explained by using FIGS. 29A to 29C and 30A to 30C. Note that the present invention is not limited to embodiment 13.

The processes through FIG. 13C of embodiment 1 and FIG. 16C of embodiment 2 are performed. The first conductive layer and the second conductive layer (hereinafter referred to as the laminate film) are etched by using resist masks 9004, 9005a, 9005b, 9006a and 9006b, and gate electrode 9001 of p-channel TFT, and gate electrode 9002b and gate signal line 9003a and 9003b of n-channel TFT are formed. Here, the gate electrode 9002a is formed to overlap with n⁻ region 9901 through gate insulating film and 9002b, with n⁻ region 9902 and 9903 through gate insulating film. (FIG. 29A)

A gate insulating film 9007 is etched by dry etching by using the resist masks 9004, 9005a, 9005b, 9006a and 9006b formed respectively over gate electrode 9001 of p-channel TFT, gate electrodes 9002a and 9002b of n-channel TFT and the gate signal line 9003a and 9003b of n-channel TFT, and gate insulating films 9008 to 9010 are formed. (FIG. 29B)

Resist masks 9004, 9005a, 9005b, 9006a and 9006b are removed, and resist masks 9011, 9012, 9013a and 9013b are formed as shown in FIG. 29C. Then, a process for forming-impurity regions that function as a source region or a drain region is conducted.

Impurity regions 9014 to 9022 are formed by doping impurity element imparting n-type conductivity. Here, ion doping using phosphine (PH$_3$) is performed (ion implantation may also be used), and the phosphorus concentration in these regions are set at between $1 \times 10^{20}$ and $1 \times 10^{21}$ atoms/cm³. Note that the concentration of impurity element imparting n-type contained in the impurity regions 9014 to 9022 formed here is designated by (n⁺). Therefore, in the Specification, impurity regions 9014 to 9022 may be designated as n⁺ regions. (FIG. 29C)

After removing resist masks 9011 to 9013, resist mask 9023 is formed to cover the whole surface of the region where n-channel TFT will later be formed. By using resist mask 9023 as a mask, a process for doping impurity element imparting p-type is conducted on a portion of a semiconductor layer where p-channel TFT is formed. Here, boron is doped as the impurity element by ion doping (ion implantation may also be used) using diborane (B$_2$H$_6$). Boron is doped to a concentration of between $5 \times 10^{20}$ and $3 \times 10^{21}$ atoms/cm³. Note that the concentration of impurity element imparting p-type contained in the impurity regions formed here is designated by (p⁺). Therefore, in the Specification, impurity regions 9025 and 9026 may be designated as p⁺ regions. (FIG. 30A)

After removing resist mask 9023, passivation film 9027 is formed. As a passivation film, SiN, SiON or SiO$_2$ etc. may be used. The thickness is between 10 nm and 100 nm and preferably between 20 nm and 50 nm.

Impurity element imparting n-type is doped by using gate 9001, 9002a, 9002b, 9003a and 9003b as masks respectively. In thus formed impurity regions 9028 to 9036, phosphorus is doped to a concentration of approximately the same or smaller than n⁻ region shown in FIG. 13B and FIG. 16B ($5 \times 10^{16}$ to $1 \times 10^{18}$ atoms/cm³ in concrete). Specifically in 9037a, 9037b, 9038a and 9038b, because passivation film 9027 also functions as a mask, penetration of impurity under the gate electrode at doping was prevented and OFF current of TFT can be kept low.

Next, activation process of the doped impurity elements (phosphorus or boron) is conducted. In embodiment 13, the activation process is performed by furnace annealing or lamp annealing. When furnace annealing is adopted, heat treatment of 450 to 650° C., preferably 500 to 550° C., here at 500° C. for 4 hours is performed.

In embodiment 13, source region and drain region of both n-channel TFT and p-channel TFT have a region where phosphorus is included at a concentration corresponding to n⁺ region. Therefore, in the heat treatment process for thermal activation, gettering effect of nickel by phosphorus can be obtained. In other words, nickel moves from channel forming region towards a direction shown by an arrow and gettered by an action of phosphorus contained in source region and drain region.

By adopting embodiment 13, activation process of the impurity elements doped into the island semiconductor layers and gettering process of the catalyst element used in crystallization may be combined. and this is effective for simplification of the manufacture.

Thus as stated in embodiment 1, TFTs of pixel matrix circuit and driver circuit formed in its peripheral are finished in the process same as those shown in FIG. 15B and FIG. 18B. Note that the manufacturing process shown in embodiment 13 is merely an example, and the order of manufacturing processes is not limited to this embodiment.

Embodiment 14

Figure 31A:
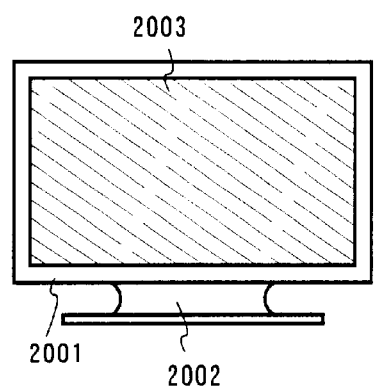
FIGS. 31A to 31C show examples of electronic devices using an active matrix liquid crystal display device of the present invention.
Figure 31B:
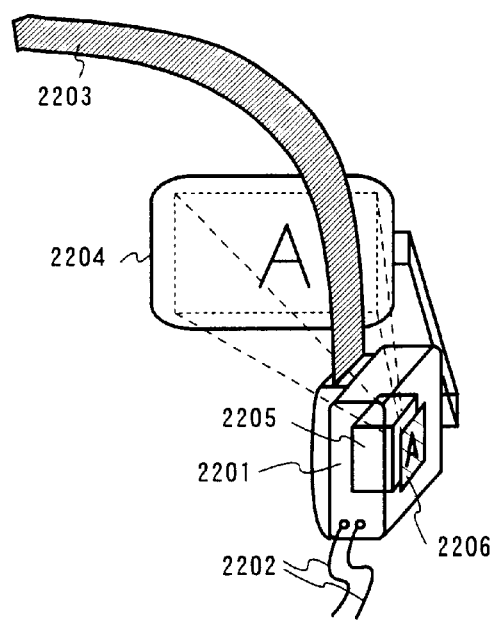
Figure 31C:
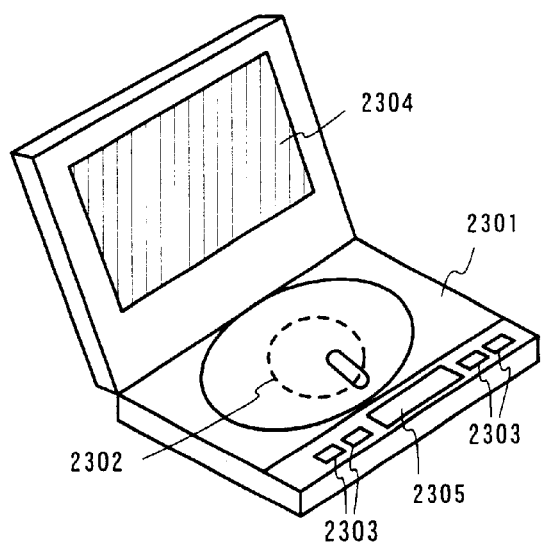

In embodiment 14, examples of applying the active matrix liquid crystal display of the present invention to a head mounted display and a DVD by using FIGS. 31A to 31C.

FIG. 31A is a display, and includes a main body 2001, a supporting section 2002 and a display device 2003. The present invention can be applied to the display device 2003.

FIG. 31B is a portion of a head mounted display (right side), and includes main body 2201, signal cable 2202, a head mounting band 2203, a projection section 2204, an optical system 2205 and a display device 2206. The present invention can be applied to the display device 2205.

FIG. 31C is an image player (concretely, a DVD player) using a recording medium, and includes a main body 2301, a recording medium 2302, control switches 2303, a display portion (a) 2304 and a display portion (b) 2305. The display portion (a) 2304 shows the information of images mainly, and the display portion (b) 2305 shows the information of letters mainly. The present invention can be applied to the display portion (a) 2304 and the display portion (b) 2305. Incidentally, the image player includes a household electronic game apparatus and the like.

As described above, the applicable range of the present invention is very wide and the present invention can be applied to electronic devices of various areas. Also, an electronic device of the present invention can be realized from using a structure combining any of the embodiments 1 to 3 and 11 to 13.

Since the active matrix liquid crystal display device of the present invention adopts "BM on TFT" structure in the pixel matrix circuit, shielding of visible radiation is available efficiently without decreasing the aperture ratio. The aperture ratio of the active matrix liquid crystal display device which the inventors of the present invention have actually manufactured exceeded 60%.

Further, since the opposing substrate shielding film is disposed for the circuit region, the operation speed of the circuit TFT is not decreased by forming a parasitic capacitance between the circuit TFT.

There is no need to align the opposing shielding film with an precise accuracy as that of a shielding film formed in the pixel matrix circuit, and therefore the opposing shielding film can be formed on the opposing substrate side.

Further, by providing the shielding film and the opposing shielding film at a distance L of 20 µm or greater, the increase of OFF current in the circuit TFT in the source signal line driver circuit due to light incident into the source signal line driver circuit, is prevented even in the structure of the present invention that uses a pair of shielding films. Further, in the case that the shielding film comprises a metal such as aluminum (Al), titanium (Ti), chromium (Cr) or tantalum (Ta) etc., error operation of driver circuit due to penetration of electromagnetic wave into the driver circuit can be possible.

Further, by driving liquid crystal by source line conversion and by holding the shielding film floating without connecting to the common line, the electric potential of the shielding film is kept at constant even when the shielding film is not connected to the common line. Here, forming a storage capacitor of a structure sandwiching dielectric between shielding film and pixel electrode become possible. Therefore there is no more needed to open a contact hole by photolithography in the interlayer insulating film disposed between the shielding film and the common line. Thus manufacturing process is reduced, achievement of high yield become possible, and manufacturing cost of active matrix liquid crystal display device can be reduced.

In addition, since the electric potential of the shielding film is kept at constant, a good contrast can be obtained in the case where a coupling capacitor of a large capacitor is formed between the shielding film and the common line by holding the shielding film at floated.

What is claimed is:

1. An active matrix liquid crystal display device comprising:
    a first substrate comprising a plurality of source signal lines, a plurality of pixel TFTs, a source signal line driver circuit and a first shielding film; and
    a second substrate having a second shielding film, wherein:
       a portion of, or all of the source signal line driver circuit is disposed over a portion of or all of the second shielding film;
       a portion of the second shielding film is disposed over a portion of the first shielding film;
       the first shielding film is floating;
       the plurality of pixel TFTs are connected to the plurality of source signal lines, and the plurality of source signal lines are connected to the source signal line driver circuit; and
       the source signal line driver circuit applies signals of an opposite polarity to each adjacent source signal line, and the polarity of the signals applied to the plurality of source signal lines is inverted by each frame.

2. An active matrix liquid crystal display device comprising:
    a first substrate comprising a source signal line driver circuit, an ITO wiring, a first shielding film and a common line held at a constant electric potential; and
    a second substrate comprising a second shielding film, wherein
       a portion of, or all of the source signal line driver circuit is disposed over a portion of or all of the second shielding film;
       a portion of the second shielding film is disposed over a portion of the first shielding film;
       the first shielding film and the ITO wiring are connected to the common line; and
       a dielectric is held between the first shielding film and the ITO wiring.

3. An active matrix liquid crystal display device comprising:
    a first substrate comprising a plurality of source signal lines, a plurality of pixel TFTs, a source signal line driver circuit, an ITO wiring, a first shielding film and a common line held at a constant electric potential; and
    a second substrate having a second shielding film, wherein:
       a portion of, or all of the source signal line driver circuit is disposed over a portion of or all of the second shielding film;
       a portion of the second shielding film is disposed over a portion of the first shielding film;
       the first shielding film is floating;
       the ITO wiring is connected to the common line;
       a dielectric is held between the first shielding film and the ITO wiring;
       the plurality of pixel TFTs are connected to the plurality of source signal lines, and the plurality of source signal lines are connected to the source signal line driver circuit; and
       the source signal line driver circuit applies signals of an opposite polarity to each adjacent source signal line, and the polarity of the signals applied to the plurality of source signal lines is inverted by each frame.

4. An active matrix liquid crystal display device according to any one of claims 1, 2 and 3 wherein the first shielding film or the second shielding film comprises an element selected from a group consisting of aluminum (Al), titanium (Ti), chromium (Cr) and tantalum (Ta).

5. An active matrix liquid crystal display device according to any one of claims 1, 2 and 3 wherein the first shielding film or the second shielding film comprises a resin in which a black pigment is dispersed.

6. An active matrix liquid crystal display device according to any one of claims 1, 2 and 3 wherein the first shielding film has a thickness between 100 nm and 300 nm.

7. An active matrix liquid crystal display device according to any one of claims 1, 2 and 3, wherein the second shielding film has a thickness between 1000 Å and 2000 Å.

8. An active matrix liquid crystal display device according to any one of claims 1, 2 and 3 wherein a distance between the first shielding film and the second shielding film is 20 µm or greater.

9. An active matrix liquid crystal display device according to any one of claims 2 and 3 wherein the dielectric is an anodically oxidized film formed by anodic oxidation of the first shielding film.

10. A rear projector comprising 3 active matrix liquid crystal display devices, wherein the active matrix liquid crystal display device comprises:
    a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

11. A single plate type rear projector comprising an active matrix liquid crystal display device, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

12. A front projector comprising 3 active matrix liquid crystal display devices, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

13. A notebook type personal computer comprising an active liquid crystal display matrix device, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

14. A mobile computer comprising an active matrix liquid crystal display device, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of signals applied to the plurality of source signal lines is inverted by each frame.

15. A goggle type display comprising two active matrix liquid crystal display devices, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

16. A goggle type display comprising an active matrix liquid crystal display device, wherein the active matrix liquid crystal display device comprises:

a first substrate comprising a plurality of source signal lines, a plurality of pixel TFTs, a source signal line driver circuit and a first shielding film; and a second substrate comprising a second shielding film, wherein a portion of, or all of the source signal line driver circuit is disposed over a portion of or all of the second shielding film; and a portion of the second shielding film is disposed over a portion of the first shielding film;

the first shielding film is floating;

the plurality of pixel TFTs are connected to the plurality of source signal lines, and the plurality of source signal lines are connected to the source signal line driver circuit; and the source signal line driver circuit applies signals of an opposite polarity to each adjacent source signal line, and the polarity of the signals applied to the plurality of source signal lines is inverted by each frame.

* * * * *